(12) United States Patent
Coyne et al.

(10) Patent No.: US 9,484,739 B2
(45) Date of Patent: Nov. 1, 2016

(54) OVERVOLTAGE PROTECTION DEVICE AND METHOD

(71) Applicant: ANALOG DEVICES GLOBAL, Hamilton (BM)

(72) Inventors: Edward John Coyne, Athenry (IE); John Twomey, Fountainstown (IE); Seamus P. Whiston, Raheen (IE); David J. Clarke, Patrickswell (IE); Donal P. McAuliffe, Raheen (IE); William Allan Lane, Waterfall (IE); Stephen Denis Heffernan, Thurles (IE); Brian A. Moane, Raheen (IE); Brian Michael Sweeney, Burren (IE); Patrick Martin McGuinness, Pallaskenry (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 21 days.

(21) Appl. No.: 14/496,839

(22) Filed: Sep. 25, 2014

(65) Prior Publication Data

US 2016/0094026 A1 Mar. 31, 2016

(51) Int. Cl.
*H02H 3/20* (2006.01)
*H02H 9/04* (2006.01)
*H01L 27/02* (2006.01)
*H02H 7/16* (2006.01)

(52) U.S. Cl.
CPC .......... *H02H 9/044* (2013.01); *H01L 27/0259* (2013.01); *H02H 7/16* (2013.01)

(58) Field of Classification Search
USPC .................................................. 361/56, 91.1
See application file for complete search history.

(56) References Cited

U.S. PATENT DOCUMENTS

| | | | |
|---|---|---|---|
| 3,436,667 | A | 4/1969 | Leonard |
| 3,660,687 | A | 5/1972 | Sahm et al. |
| 4,520,277 | A | 5/1985 | Hahn |
| 4,528,461 | A | 7/1985 | Shackle et al. |
| 4,633,283 | A | 12/1986 | Avery |
| 5,061,652 | A | 10/1991 | Bendernagel et al. |
| 5,212,618 | A * | 5/1993 | O'Neill ............... H01L 27/0248 257/356 |
| 5,276,582 | A | 1/1994 | Merrill et al. |
| 5,341,005 | A | 8/1994 | Canclini |
| 5,343,053 | A | 8/1994 | Avery |

(Continued)

FOREIGN PATENT DOCUMENTS

| | | |
|---|---|---|
| DE | 10 2007 040 875 A1 | 3/2009 |
| EP | 0 168 678 A2 | 1/1986 |

(Continued)

OTHER PUBLICATIONS

Salcedo et al., Bidirectional Devices for Automotive-Grade Electrostatic Discharge Applications, IEEE Electron Device Letters, vol. 33, No. 6, Jun. 2012, 3 pages.

(Continued)

*Primary Examiner* — Dharti Patel
(74) *Attorney, Agent, or Firm* — Knobbe Martens Olson & Bear LLP

(57) ABSTRACT

A protection device is provided that exhibits a turn on time of order of one nanosecond or less. Such a device provides enhanced protection for integrated circuits against electrostatic discharge events. This in turn reduces the risk of device failure in use. The protection device can include a bipolar transistor structure connected between a node to be protected and a discharge path.

27 Claims, 22 Drawing Sheets

(56) References Cited

U.S. PATENT DOCUMENTS

| | | |
|---|---|---|
| 5,436,486 A | 7/1995 | Fujishima et al. |
| 5,440,151 A | 8/1995 | Crevel et al. |
| 5,440,162 A | 8/1995 | Worley et al. |
| 5,473,169 A | 12/1995 | Ker et al. |
| 5,485,023 A | 1/1996 | Sumida |
| 5,541,801 A | 7/1996 | Lee et al. |
| 5,576,557 A | 11/1996 | Ker et al. |
| 5,594,266 A | 1/1997 | Beigel et al. |
| 5,602,409 A | 2/1997 | Olney |
| 5,610,425 A | 3/1997 | Quigley et al. |
| 5,615,074 A | 3/1997 | Avery |
| 5,637,892 A | 6/1997 | Leach |
| 5,637,901 A | 6/1997 | Beigel et al. |
| 5,652,689 A | 7/1997 | Yuan |
| 5,663,860 A | 9/1997 | Swonger |
| 5,719,432 A | 2/1998 | Kariyazono et al. |
| 5,736,769 A | 4/1998 | Nishiura et al. |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,818,088 A | 10/1998 | Ellis |
| 5,832,376 A | 11/1998 | Henderson et al. |
| 5,862,301 A | 1/1999 | Gontowski |
| 5,889,644 A | 3/1999 | Schoenfeld et al. |
| 5,892,264 A | 4/1999 | Davis et al. |
| 5,895,940 A | 4/1999 | Kim |
| 5,998,813 A | 12/1999 | Bernier |
| 6,097,068 A | 8/2000 | Brown et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,501,632 B1 | 12/2002 | Avery et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,713,816 B1 | 3/2004 | Wolf et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,870,202 B2 | 3/2005 | Oka |
| 6,927,957 B1 | 8/2005 | Bakulin et al. |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,471,493 B1 | 12/2008 | Huang et al. |
| 7,538,998 B2* | 5/2009 | Tsai .................. H01L 27/0262 361/111 |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,859,082 B2 | 12/2010 | Stecher |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,278,684 B1 | 10/2012 | Walker et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,946,822 B2 | 2/2015 | Salcedo et al. |
| 8,947,841 B2 | 2/2015 | Salcedo et al. |
| 2001/0031521 A1 | 10/2001 | Pan et al. |
| 2001/0040254 A1 | 11/2001 | Takiguchi |
| 2002/0021538 A1 | 2/2002 | Chen et al. |
| 2002/0033520 A1 | 3/2002 | Kunikiyo |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0125931 A1 | 9/2002 | Yue et al. |
| 2002/0153564 A1 | 10/2002 | Shirai |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2003/0147190 A1 | 8/2003 | Ker et al. |
| 2003/0151877 A1* | 8/2003 | Young .................. H01L 27/0292 361/212 |
| 2004/0048428 A1 | 3/2004 | Tanomura |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0057866 A1 | 3/2005 | Mergens et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0111150 A1 | 5/2005 | Jang et al. |
| 2005/0133869 A1 | 6/2005 | Ker et al. |
| 2005/0151160 A1 | 7/2005 | Salcedo et al. |
| 2005/0195540 A1 | 9/2005 | Streibl et al. |
| 2005/0280091 A1 | 12/2005 | Huang et al. |
| 2006/0033163 A1 | 2/2006 | Chen |
| 2006/0091497 A1 | 5/2006 | Sato |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2006/0250732 A1 | 11/2006 | Peachey |
| 2007/0007545 A1 | 1/2007 | Salcedo et al. |
| 2007/0058307 A1 | 3/2007 | Mergens et al. |
| 2007/0138558 A1 | 6/2007 | Saitoh |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2008/0218920 A1 | 9/2008 | Vanysacker et al. |
| 2009/0032821 A1 | 2/2009 | Tseng et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0122452 A1 | 5/2009 | Okushima |
| 2009/0206376 A1 | 8/2009 | Mita et al. |
| 2009/0230426 A1 | 9/2009 | Carpenter et al. |

(56) References Cited

U.S. PATENT DOCUMENTS

| | | |
|---|---|---|
| 2009/0231766 A1 | 9/2009 | Chang et al. |
| 2009/0236631 A1 | 9/2009 | Chen et al. |
| 2009/0309128 A1 | 12/2009 | Salcedo et al. |
| 2010/0027174 A1 | 2/2010 | Galy et al. |
| 2010/0059028 A1 | 3/2010 | Ueno |
| 2010/0109631 A1 | 5/2010 | Vinson |
| 2010/0133583 A1 | 6/2010 | Mawatari et al. |
| 2010/0148265 A1 | 6/2010 | Lin et al. |
| 2010/0163973 A1 | 7/2010 | Nakamura et al. |
| 2010/0171149 A1 | 7/2010 | Denison et al. |
| 2010/0301389 A1 | 12/2010 | Kushner et al. |
| 2010/0321092 A1 | 12/2010 | Momota et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0133246 A1 | 6/2011 | Ueno |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0091503 A1 | 4/2012 | Su |
| 2012/0133025 A1 | 5/2012 | Clarke et al. |
| 2012/0175673 A1 | 7/2012 | Lee |
| 2012/0199874 A1 | 8/2012 | Salcedo et al. |
| 2012/0205714 A1 | 8/2012 | Salcedo et al. |
| 2012/0286325 A1 | 11/2012 | Coyne |
| 2012/0286327 A1 | 11/2012 | Coyne |
| 2012/0286396 A1 | 11/2012 | Coyne |
| 2012/0293904 A1 | 11/2012 | Salcedo et al. |
| 2013/0099280 A1 | 4/2013 | Coyne |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo et al. |

FOREIGN PATENT DOCUMENTS

| | | |
|---|---|---|
| EP | 0 234 269 A2 | 9/1987 |
| EP | 1 703 560 A2 | 9/2006 |
| EP | 2 246 885 A1 | 11/2010 |
| KR | 10-2006-0067100 | 2/2006 |
| KR | 10-2009-0123683 | 12/2009 |
| KR | 10-2010-0003569 | 1/2010 |
| WO | WO 90/15442 A1 | 12/1990 |
| WO | WO 95/22842 A1 | 8/1995 |
| WO | WO 97/10615 A1 | 3/1997 |
| WO | WO 2008/135812 A1 | 11/2008 |
| WO | WO 2010/011394 A1 | 1/2010 |

OTHER PUBLICATIONS

Anderson et al., ESD Protection under Wire Bonding Pads, EOS/ESD Symposium 99-88, pp. 2A.4.1-2A.4.7 (1999).

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Chang et al., High-k Metal Gate-bounded Silicon Controlled Rectifier for ESD Protection, 34th Electrical Overstress/Electrostatic Discharge Symposium, Sep. 2012, 7 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

De Heyn et al "Design and Analysis of New Protection Structures for Smart Power Technology with Controlled Trigger and Holding Voltage" 2001 IEEE International Reliability Physics Symposium Proceedings 39th Annual, Orlando Florida, Apr. 30-May 3, 2001, IEEE International Reliability Physics Symposium, New York, NY, IEEE Apr. 30, 2011, pp. 253-258.

Gendron et al., "Deep Trench NPM Transistor for Low-RON ESD Protection of High-Voltage I/Os in Advance Smart Power Technology," BIPOLAR/BICMOS Circuits and Technology Meeting, IEEE, Oct. 1, 2006, pp. 1-4.

Urresti et al., "Lateral Punch-Through TVS Devices for on-Chip Protection in Low-Voltage Applications," Microelectronics Reliability, 2005, pp. 1181-1186, vol. 45.

Walker et al., "Novel Robust High Voltage ESD Clamps for LDMOS Protection," 45th Annual International Reliability Physics Symposium, 2007, IEEE International, Apr. 1, 2007, pp. 596-597.

Extended European Search Report for European Patent App. No. 15183728.3, dated Mar. 3, 2016, in 7 pages.

\* cited by examiner

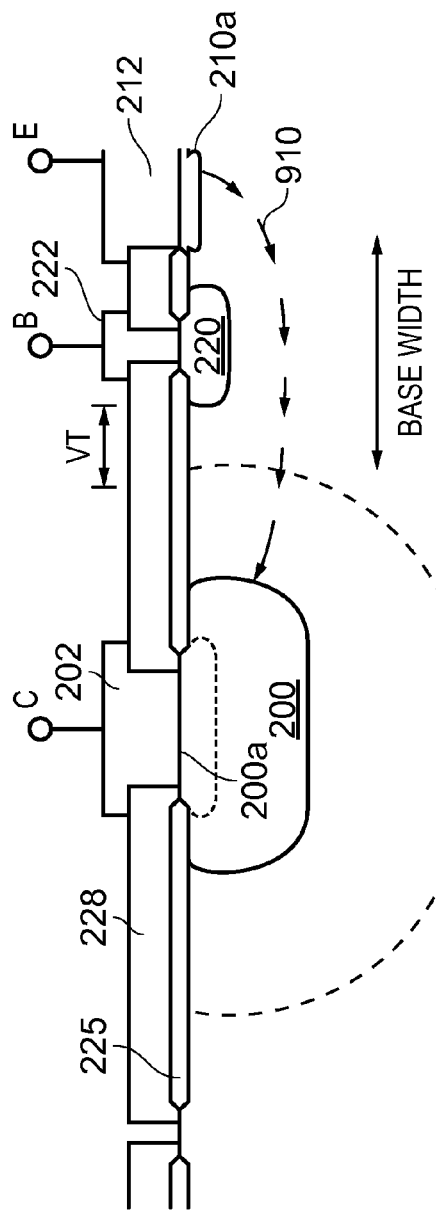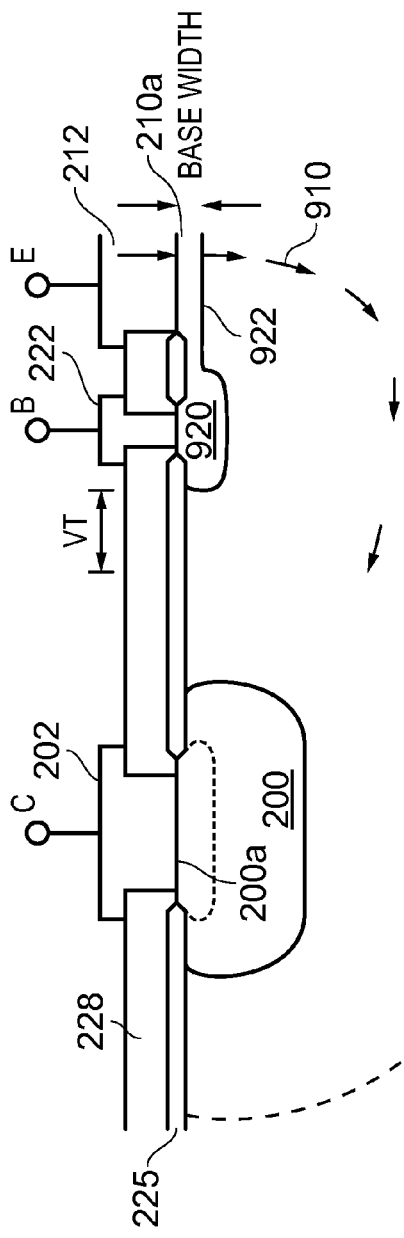

OVERVOLTAGE PROTECTION DEVICE AND METHOD

BACKGROUND

1. Field

This disclosure relates to circuits to provide other components with protection against overvoltage, such as electrostatic discharge (ESD) and/or electrical overstress (EOS) events.

2. Description of the Related Technology

Modern electronics relies on integrated circuits where large numbers of transistors are provided within a single package. For performance, such as speed, the transistors are often designed to operate at relatively low voltages, for example, between a few volts and a few tens of volts.

Integrated circuits are packaged to protect them, but need to connect to components outside of the package by way of legs or pins or similar structures. These may in turn connect to terminals, connectors or sockets provided on a product in which the integrated circuit is provided. Thus, even when an integrated circuit is mounted on a circuit board, it can be subjected to electrostatic shocks. It is known that integrated circuits waiting to be placed on a circuit board are especially vulnerable to electrostatic discharge or other overvoltage events.

It is desirable, and known, to provide circuits that provide overvoltage protection. Simple examples are the provision of reverse biased diodes between a node to be protected and the supply rails of an integrated circuit.

However, in more sophisticated voltage protection circuits it is desirable that:

1) The circuit does not trigger until a trigger voltage is reached.
2) That once the circuit has triggered, the voltage "snaps back" to a smaller holding voltage.
3) The circuit is fast so that it can respond to an ESD event before damage occurs to the integrated circuit.

Performance of the circuits can be assessed against several published test standards. One such standard is the International Electrotechnical Commission (IEC) CDM (charged device model) where peak current can be in the range of 6 A with a rise time of less than 400 pico-seconds. ESD events of this nature may give rise to gate oxide damage of MOSFETs, junction damage and charge trapping with integrated circuits.

It is desirable to provide a robust and a fast protection circuit.

SUMMARY

According to a first aspect of this disclosure there is provided an overvoltage protection device comprising a bipolar transistor. The bipolar transistor has base, collector and emitter regions. The collector and emitter regions are provided adjacent one another.

By varying the distance between the collector and emitter regions the voltage at which punch-through driven triggering of the overvoltage protection device occurs can be controlled. Thus, a particular distance between the collector and emitter regions can be selected to achieve a desired trigger voltage of the overvoltage protection device.

A conductor may extend above a semiconductor between the collector and emitter regions and be electrically isolated from the semiconductor. The conductor can be held at a voltage, such as the emitter voltage, such that it acts as a field plate or resurf structure. Alternatively, the conductor may be used as a gate so as to form a MOSFET having a channel within the bipolar transistor.

The overvoltage protection device may further comprise a capacitor connected between a node to be protected and the base (or base/gate) of the transistor.

According to a second aspect of this disclosure there is provided an overvoltage protection device comprising a bipolar transistor structure. The bipolar transistor structure has base, collector and emitter regions. The collector and emitter regions are in a current flow path that is connected to a node to be protected from an overvoltage event. The current flow path extends to a discharge path. The overvoltage protection device further comprises a component, such as a suitably connected capacitor or diode, to facilitate turn on of the protection device.

Advantageously a capacitor has a first terminal connected to the base terminal, and a second terminal connected to the collector and/or the node to be protected. In certain configurations the bipolar transistor structure may have a doping concentration within its various regions that makes the device asymmetric (i.e. the collector-base and base-emitter regions are different). However, it remains possible to provide a circuit where the bipolar transistor structure is symmetric or substantially symmetric, to give bi-directional protection. For example, a bi-directional protection device can be used to protect an integrated circuit from both a positive polarity ESD event and a negative polarity ESD event. In such an arrangement capacitors may connect between the base and the collector and between the base and the emitter.

The bipolar transistor structure may be associated with a second bipolar transistor structure to form a silicon controlled rectifier (SCR). Regions of silicon may be shared by both of the transistors.

The base of the bipolar transistor structure may be connected to a second current flow path having at least one of a resistive impedance and an inductive impedance to control base current in the transistor when the transistor is on.

According to a third aspect of this disclosure there is provided an overvoltage protection device comprising a bipolar transistor, wherein the bipolar transistor has base, collector and emitter regions. The collector is connected to a node to be protected and the emitter is connected to a discharge path, such as a power rail or ground supply. The transistor has a relatively thin base region disposed beneath (or above) the emitter region. It is thus possible to modify the structure of the bipolar transistor to make it respond more quickly. For example, implementing the bipolar transistor with a relatively thin base region can improve turn-on speed, which can aid in reducing voltage build-up during an ESD and/or EOS event.

In an embodiment the overvoltage protection device comprises a bipolar transistor connected between a node to be protected and a discharge path. The base width of the transistor is selected such that carrier transit time across the base gives rise to a unity gain frequency ($F_T$) value of the transistor substantially equal to an inverse of a rise time of an ESD event. Preferably, the $F_T$ value is greater than 1 GHz such that the corresponding rise time is less than one nanosecond.

Preferably, the transistor base further comprises a further base region disposed adjacent the collector, but separated therefrom. The further base region and the collector are separated by a region of reduced doping. The distance by which the collector and the further base region are separated controls a breakdown voltage of the device.

According to a fourth aspect of this disclosure there is provided an overvoltage protection device comprising a transistor or a silicon controlled rectifier in combination with at least one clamping diode.

The clamping diodes may be provided in parallel and series to synthesize a composite diode having desirable electrical characteristics. The diode or composite diode may be provided in parallel with the transistor or the silicon controlled rectifier. Additionally or alternatively the clamping diodes may be connected to a control node of the transistor or silicon controlled rectifier. The transistor may be a bipolar transistor or a FET.

In another aspect, a method of providing overvoltage protection to a node is provided. The method includes forming a transistor having a body of a first type of semiconductor and first and second regions of a second type of semiconductor, one of the first and second regions being connected to a node to be protected and the other of the regions being connected to a discharge path. Additionally, one or more of the following apply: (a) the body forms a base region of the transistor and a capacitance is provided between the node to be protected and the body region to inject change to turn the transistor on; (b) a layer of the first type of semiconductor is provided beneath the one of the regions that acts as an emitter of the transistor to form a bipolar transistor with a unity gain frequency of greater than 1 GHz; (c) at least one clamping diode extends between the first and second regions; (d) the first and second regions are adjacent one another but not contiguous such that punch through occurs to indicate conduction in the transistor; (e) the first and second regions are adjacent one another and separated from one another, and a gate electrode is formed between them to allow a voltage at the node to be protected in excess of a threshold voltage to cause conduction between the first and second regions along a channel; (f) the base-collector interface region is enlarged by forming the base on either side of or at least partially around the region connected to the node to be protected; and/or (g) the transistor forms a field effect transistor and a clamping diode is connected to the gate of the field effect transistor to turn it one once a breakdown voltage for the diode is reached.

BRIEF DESCRIPTION OF THE DRAWINGS

Embodiments of overvoltage protection devices will now be described, by way of non-limiting example, with reference to the accompanying drawings.

FIG. 8 reproduces the transistor as shown in FIG. 2, with the addition of an indication of the base width and the bipolar path within the transistor.

FIG. 9 shows a modified structure where the base is much thinner.

FIG. 18 is a graph showing a simulation of the I-V characteristic of the device shown in FIG. 17 in a nominally off state, and indicating where punch through and then impact ionization effects start to turn the transistor on.

DETAILED DESCRIPTION OF EMBODIMENTS

US 2011-0101444 discloses an overvoltage protection device 5 based around a horizontal NPN transistor which is formed within an insulated well, although it should be understood that this disclosure is not limited to the use of such silicon-on-insulator transistors. Such a device is shown in FIG. 1.

Figure 1:
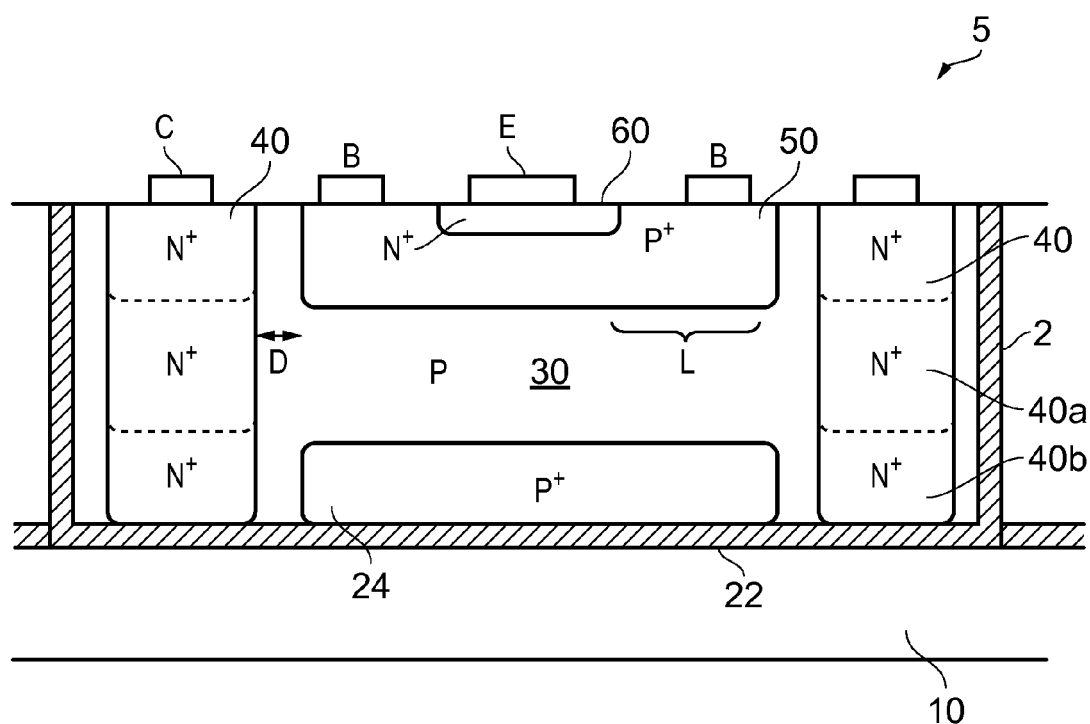
FIG. 1 shows a known ESD protection device as described in US2011-0101444.

As shown in FIG. 1, a layer of insulation 22 is formed over a substrate 10. The substrate may be a semiconductor. Advantageously the semiconductor is silicon, but other semiconductors may also be used. A relatively heavily doped P+ layer 24 is provided over the layer of insulation 22 or just over part of it which in the finished device is beneath a base region B of the transistor as shown in FIG. 1. An epitaxial layer 30 of P type material is provided over the P+ region 24. The P type material of the epitaxial layer 30 forms a body of the overvoltage protection device. The P+ region 24 helps inhibit the formation of parasitic vertical transistors and also, being heavily doped, helps to shield the base region B and emitter region E of the device from electrostatic fields resulting from the epitaxial layer 30 being at a different potential relative to the substrate 10.

A first N type region 40 is formed, as shown in FIG. 1, towards the left hand side of the device. The device 5 in this example has rotational symmetry such that the same region 40 also exists on the right hand side of the device 5. This region forms a collector C.

A P+ region 50 is implanted to form a base region B, the P+ region 50 being implanted adjacent but spaced apart from the N type region 40. A further N+ region 60 that forms the emitter E is implanted within the P+ region 50. As the transistor 5 is deliberately fabricated as a horizontal structure, the collector regions 40 need only be provided in the vicinity of the surface. Alternatively the $N^+$ region 40 can be extended by forming region 40a, or regions 40a and 40b, as illustrated. It will be appreciated that as the device may be formed by growing an epitaxial layer over an initial (handle) wafer, then region 40b may be implanted, or otherwise doped, before the layer containing region 40a is grown on the wafer. Similarly, region 40a may be implanted with dopant before a top layer containing region 40 is grown on the wafer or it can be done at the same time.

For a bidirectional overvoltage protection device that provides protection against an overvoltage condition, such as an electrostatic discharge event, of either polarity it is preferable for the regions 40 and 50 to be doped to a similar concentration such that either can function as a collector or as an emitter of the lateral NPN transistor. However, in certain configurations, such as unidirectional configurations, the transistor may be fabricated such that it has one region where performance is enhanced when that region is used as the emitter.

In the example discussed here, the N type regions 40 and 50 are doped to around $10^{16}$ donor impurities per cubic centimeter whilst the epitaxial layer 30 associated with the P type body is more lightly doped at around $10^{15}$ acceptor impurities per cubic centimeter.

Such a device triggers automatically as the voltage across it increases. The trigger mechanism is provided and controlled by controlling the lateral extent of a distance D between the edge of the collector region and the edge of the base region to adjust the trigger voltage, and distance L representing the width of the base region to adjust the holding voltage.

The distances D and L can be selected at production by the use of mask positioning. Thus, by controlling the distances D and L the voltage at which punch through occurs and triggers the device to conduct can be controlled. Device triggering can also be controlled through adjusting impact ionization driven breakdown mechanisms.

The holding voltage of the device can also be controlled by controlling the base current in the horizontal transistor.

The above device meets the transmission-line pulse (TLP) test requirements in terms of transient response. However, the response of the horizontal NPN transistor that provides the overvoltage and ESD protection is constrained by device physics.

In somewhat simplistic terms, the current flow in a semiconductor device could be attributed to the combination of minority carrier current flow and to majority carrier current flow. Typically, majority carrier current flow mechanisms are relatively fast, whereas minority carrier mechanisms are relatively slow.

If we consider the turn on mechanism of the device of FIG. 1 due to impact ionization, then as the voltage across the device rises the collector-base voltage gives rise to impact ionization which has a very rapid (for example, sub pico-second) response time as it is a majority carrier breakdown event. However, the impact-ionization initiated breakdown is used to inject electrons into the P type material of the bipolar transistor, and as this is a minority carrier current flow it is somewhat slower, thereby giving rise to a restriction in the natural turn on time of such a device.

Although the overvoltage protection based around the transistor shown in FIG. 1 may further include a vertical transistor within them for providing an SCR action, for the purposes of simulating and explaining modifications to the turn on time, only the action of the lateral transistor need be considered.

Figure 2:
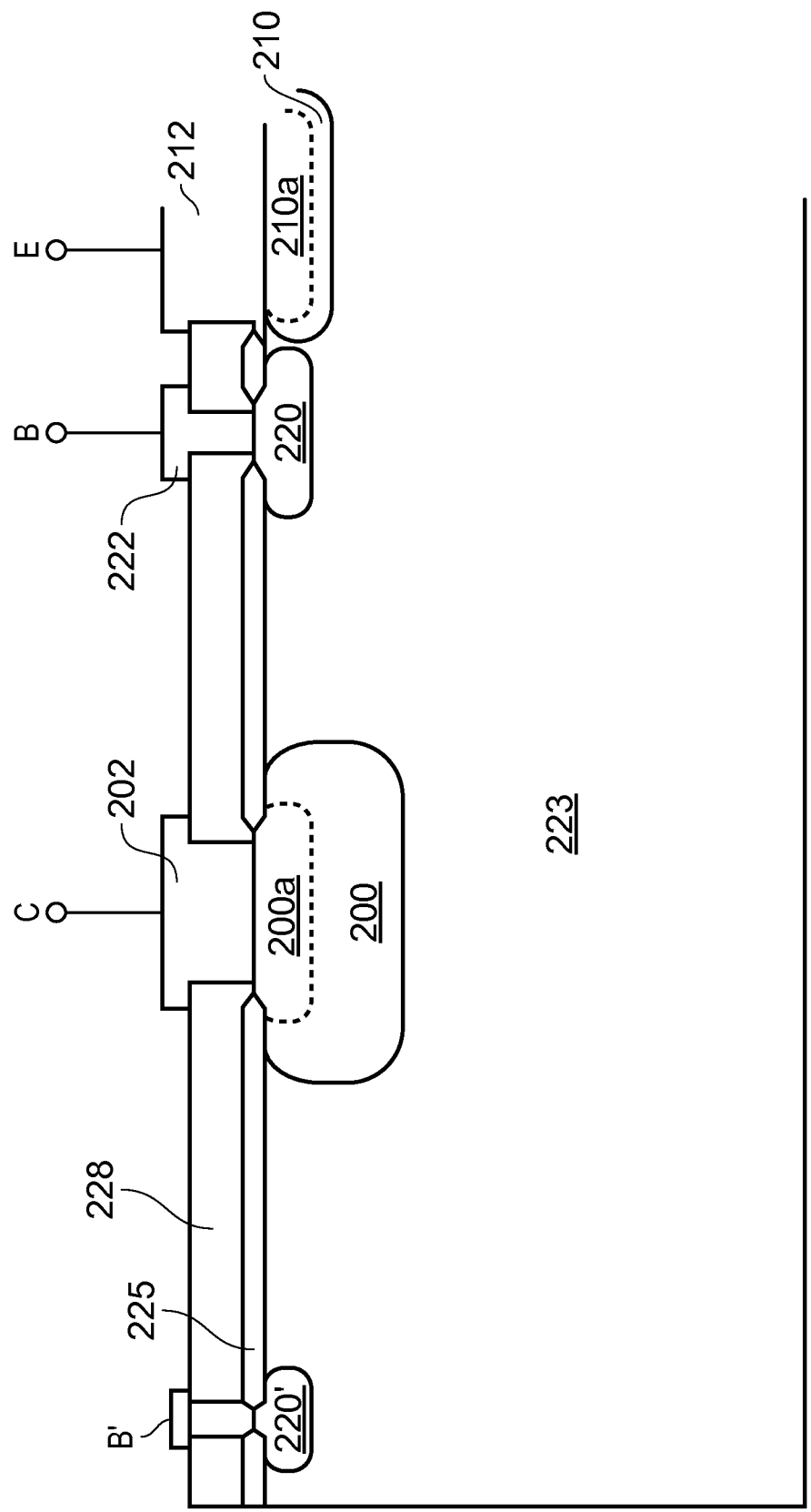
FIG. 2 is a cross-section through a lateral NPN transistor which serves as representative device for the purposes of modelling or testing how changes can modify the turn on time of a protection device.

Transistor operation was simulated by the inventors for a lateral NPN transistor whose structure is shown in FIG. 2. The transistor shown in FIG. 2 comprises a collector region 200 formed beneath a collector contact 202, an emitter region 210 beneath an emitter contact 212, and a base region 220 beneath a base contact 222. All these regions are provided within an epitaxial layer 223. The regions 200 and 210 are (in this example) N doped silicon, and the region 220 is highly doped P type silicon. Additional very highly doped regions 200a, 210a may be provided where the silicon is doped to its limit or near to its limit in order to provide low resistance interface regions within the collector and emitter contacts 202 and 212. The surface of the device is covered with layers of passivation, such as an oxide layer 225 and a further insulating layer 228 which may also be oxide or might be a nitride or other suitable dielectric material. It will be appreciated that by swapping the semiconductor device a PNP transistor can be formed. For example, the doping types of all the layers, regions, and wells of the protection device can be opposite to those described above to provide a PNP transistor.

Optionally a second base contact B', formed by a diffusion 220' and associated via can be made on the other side of the collector 200, as shown. The second base contact B' makes the device more symmetric (from an electrical point of view) and helps prevent lateral punch through where a depletion region from the collector travels around the device (for a device not having a ring shaped collector encircling the base and emitter when viewed from above) to the emitter.

FIGS. 3a to 3d show the evolution of the areas of impact ionization and the boundary of the depletion region at periods of 0.4 pico-seconds, 0.6 nano-seconds (ns), 15 ns and 100 ns respectively, after the application of an ESD event. In each of the Figures the edge of the collector doping is represented by dashed line 300. Similarly the spatial extent of the depletion region is represented by chain dot line 302. Areas of relatively high impact ionization are denoted by the shaded regions 310 and areas of lesser, but still significant impact ionization are denoted by the areas 320.

Impact ionization tends to be concentrated in areas of high field strength, or areas of moderate field strength and high current density. Starting through the time sequence (FIG. 3a), at 0.4 ps the diode breakdown of the collector-base diode has initiated, with areas 310 exhibiting very large impact ionization, and areas 320 exhibiting lesser amounts of impact ionization. It can also be seen that, for most of the device the depletion region 302 is following the profile of a device in its non-conducting state. After 0.6 ns (FIG. 3b) the device is starting to conduct collector current, and hence the extent of the area of impact ionization near the surface of the device is becoming reduced as the potential difference across the device in that region becomes reduced.

Figure 3A:
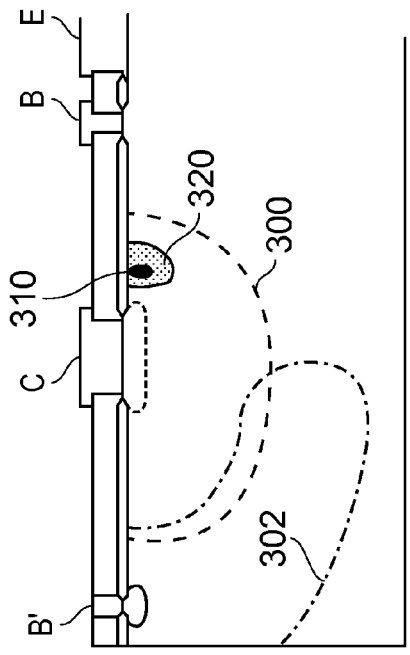
FIGS. 3a to 3d show the evolution of regions in impact ionization in response to an overvoltage (ESD) event.
Figure 3B:
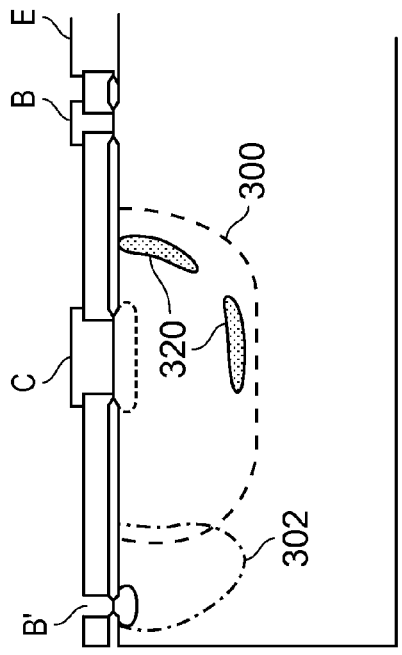
Figure 3C:
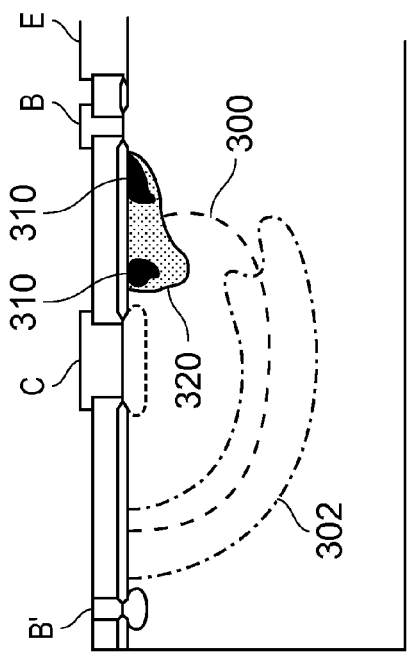

By the time 15 ns is reached, as shown in FIG. 3c, the device is mainly turned on and areas of impact ionization are relatively modest and constrained to the regions 320.

Figure 3D:
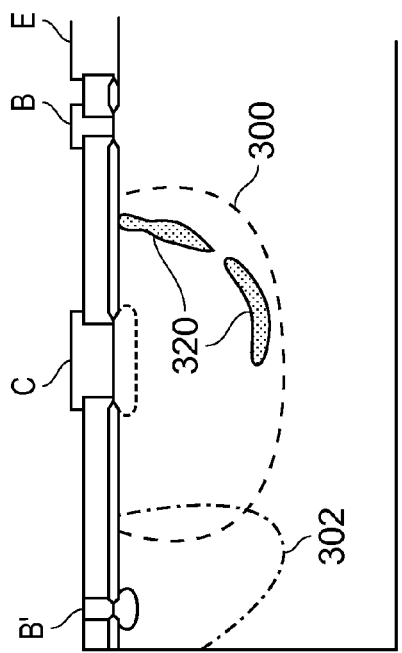

By 100 ns the device is fully turned on and very little has changed comparing FIG. 3d to FIG. 3c.

Had the electron current been illustrated, then at 0.4 ps and 0.6 ns there would have been a relatively strong electron flow between the base and collector contacts. However, by 15 ns and 100 ns, this flow would be significantly reduced as the normal transistor action takes over.

The inventors investigated options for modifying the devices shown in FIGS. 1 and 2 so as to further improve its turn on time whilst still allowing the breakdown and holding voltages to be layout adjustable and/or to be controlled by external components.

Several ways were identified, and one or more of the following options can be used either alone or in combination:

1. Connect a capacitor between the collector and the base so as to turn the bipolar transistor on more quickly. The capacitance reduces the switch on time because it is no longer necessary to wait for impact ionization to provide the entirety of the base current to the bipolar transistor.
2. Provide a high speed bipolar transistor, having the same architecture, but with a smaller base width (i.e. vertical depth). A reduction in base width reduces the time for the minority carriers to propagate across the emitter-base junction, and thereby speeds up the response of the device. However fast transistors tend to take up significantly more area, generally between five and ten times the area so the cost involved is significantly greater.
3. Provide a clamping diode across the transistor. Such a diode can be provided as a parallel device, but takes up area on the chip. In such an arrangement it may be desirable to reduce the trigger voltage of the transistor such that it is closer to the holding voltage, which gives a bigger voltage window in which to operate the diode. As diodes can be quite resistive the diode needs to be physically expansive. Schottky and Zener diodes may be used as they give localized breakdown. In order to reduce the amount of "real estate" or area required on the semiconductor substrate a vertical diode may be provided. A vertical diode gives a more uniform breakdown characteristic, and the breakdown occurs over a bigger area. Thus the device is more area efficient relative to a lateral diode. In some embodiments the diode can be provided internally to the transistor by making the transistor symmetric, and putting the base on the outer side of the collector.
4. Provide a punch through diode by adjusting the space between the collector and the emitter.
5. Provide a high voltage MOS device. This can be achieved by forming a plate over the silicon between the collector and the base, thereby effectively forming a channel at the surface of the device which provides a fast MOSFET within the structure of a bipolar transistor. As the MOS channel conducts, this gives rise to impact ionization at the drain/collector edge which gives rise to a current which provides a base current to turn the bipolar transistor on.
6. Provide an intrinsic diode.
7. Replace the bipolar transistor which a fast MOS device and clamping.

Figure 4:
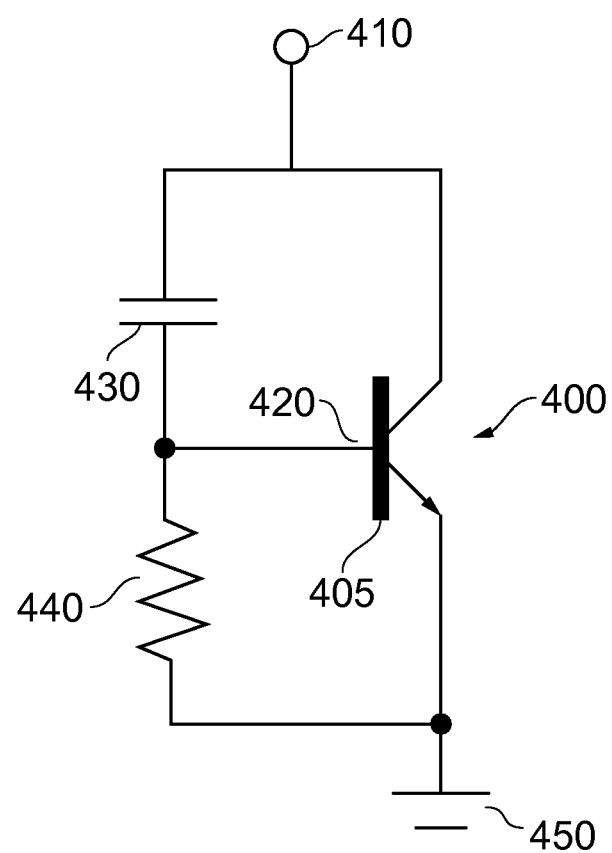
FIG. 4 is a circuit diagram where the lateral NPN transistor of FIG. 2 has its collector connected to a node that is to be protected from ESD events, and where a capacitor is connected between the node to be protected and the base of the transistor.

FIG. 4 schematically illustrates a protection device or circuit 400 incorporating a bipolar NPN transistor 405, which can be implemented using the bipolar transistor configurations shown in FIG. 1 or 2. A node 410 corresponds to a node to be protected from overvoltage, such ESD and/or EOS events. A circuit to be protected by the protection circuit 400 can be electrically connected to the node 410.

The transistor 405 has its collector connected to the node 410 which is protected from overvoltage events by the protection circuit 400 comprising the transistor 405. The node 410 may be any node within an integrated circuit, such as an input node or output node, an internal node or one of the power rails. The protected node 410 is coupled to the base 420 of the transistor 405 by way of a capacitor 430. The capacitor 430 corresponds to an explicit capacitive structure rather than merely parasitic capacitance. In one embodiment, the capacitor 430 has a value greater that 40 pF, for example, a value between 50 pF and 100 pF. Optionally a resistor 440 may be coupled between the base 420 and the emitter of the transistor 405, which may be connected to a local ground or a supply rail that serves as a discharge path 450 for the overvoltage event. Simulations of the device response were performed in respect of overvoltage events as defined by the IEC CDM standard in which the overvoltage event comprises a fast transient with a rise time of less than 1 ns.

Figure 5:
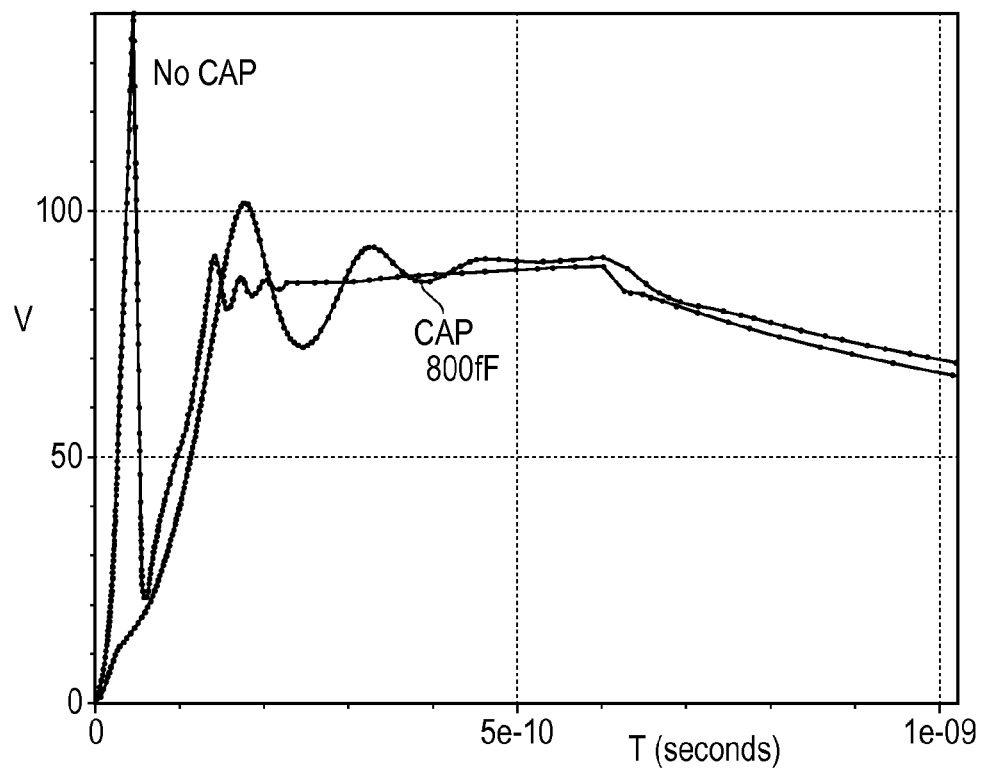
FIG. 5 is a graph comparing transient response for the circuit of FIG. 4 where the capacitor is disconnected, and when it has a value of 800 fF.

FIG. 5 compares the clamping effect of the device when exposed to an IEC overvoltage event, when there is no capacitor 430 provided and when an 800 fF ($8 \times 10^{-13}$ F) capacitor 430 is provided. It can be seen in the absence of the capacitor the transient voltage exceeded 150 volts, whereas in the presence the 800 fF capacitor the maximum voltage is just slightly over 100 volts. In both cases the device can be considered to be turned on by around 0.3 ns.

Figure 6:
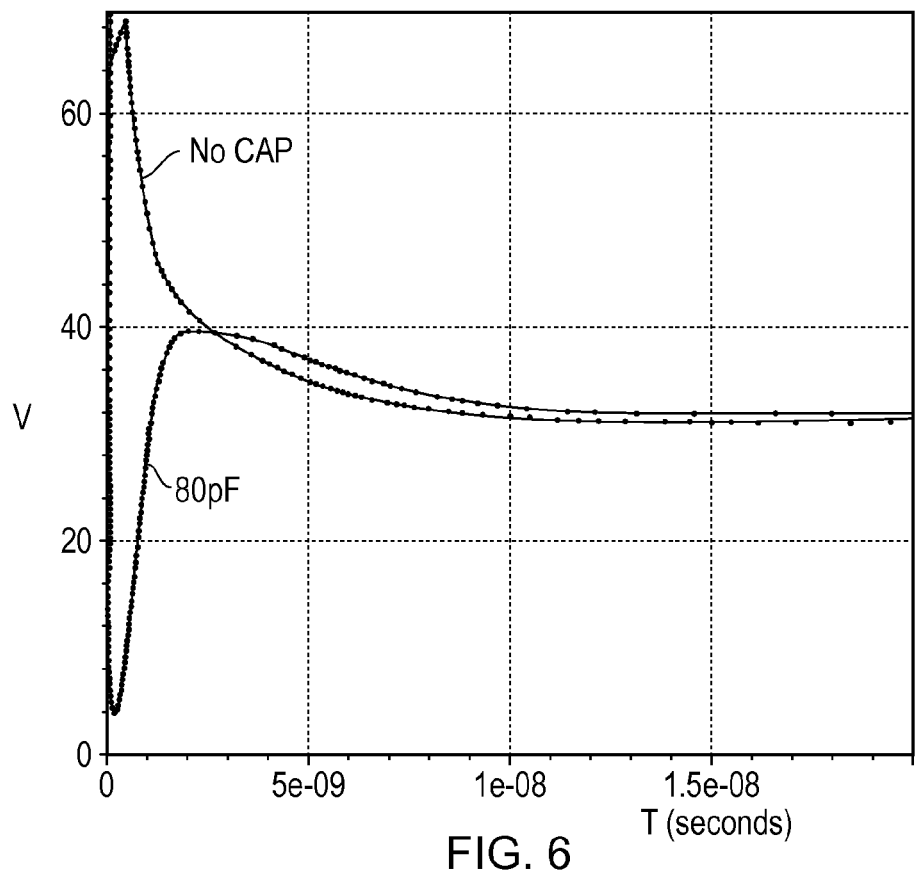
FIG. 6 is a graph comparing the transient response for the circuit of FIG. 4 when the capacitor is disconnected and when it has a value of 80 pF.

FIG. 6 is a graph comparing the transient response for the circuit 400 of FIG. 4 when the capacitor 430 is disconnected and when the capacitor 430 has a value of 80 pF. Although FIG. 6 shows the same data for the case in which the capacitor 430 is disconnected as FIG. 5, the graph is on a different scale. Here it can be seen that with an 80 pF capacitor the maximum voltage transient was about 40 volts, with the device heading towards a holding voltage of 30 volts. Thus the voltage overshoot is much reduced when using a 80 pF capacitor relative to a configuration in which the capacitor 430 is disconnected.

Figure 7:
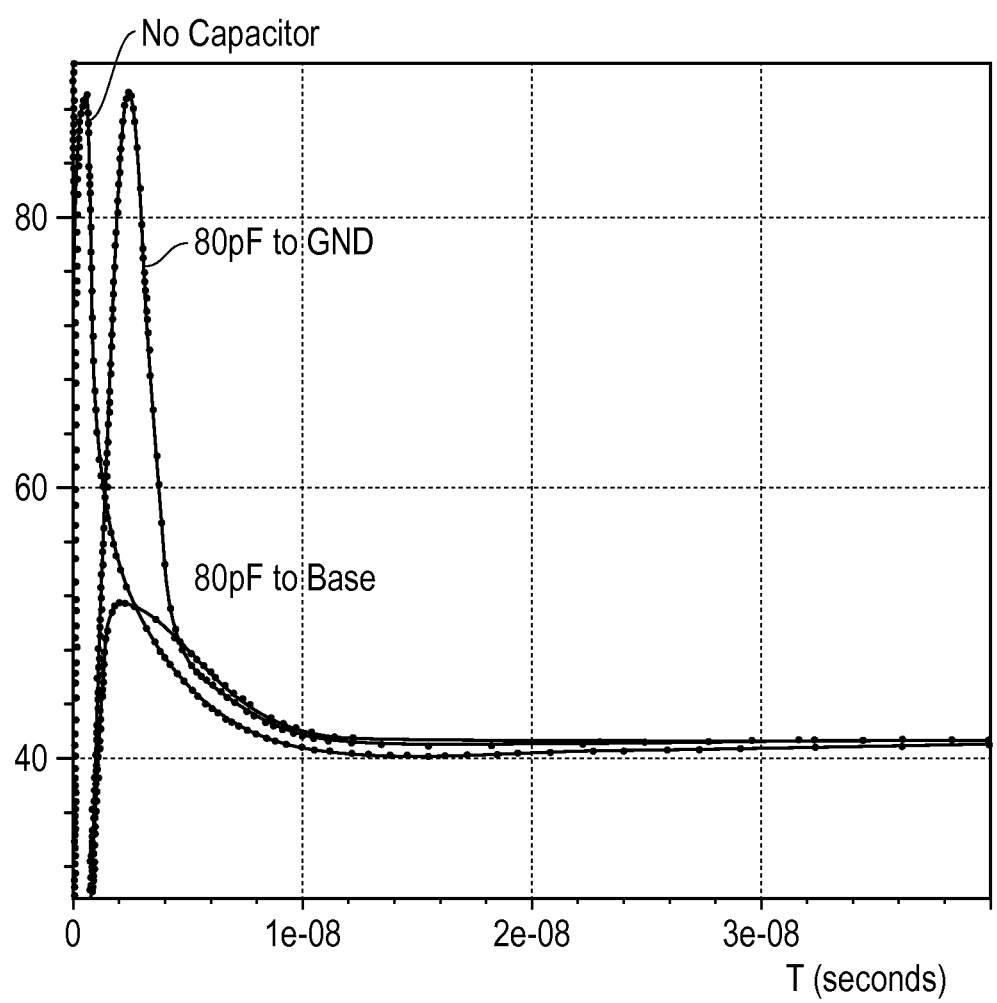
FIG. 7 is a graph comparing the response when and 80 pF capacitor is connected between the node to be protected and ground, with the response of connecting the capacitor to the base of the transistor.

FIG. 7 shows similar data, but with the 80 pF capacitor either connected from the collector terminal to ground, or from the collector terminal to the base. The provision of the capacitor between the node to be protected (410) and ground limits the IEC overvoltage event to around 90 volts, whereas connecting the same capacitor between the node to be protected 410 and the base of the transistor 405 limits the overvoltage event in this example to around 50 volts. The simulations for FIGS. 6 and 7 were performed using slightly different device structures, in terms of feature sizes and doping levels, so the clamping voltages are slightly different, but this does not detract from the validity of these comparisons.

A further approach which can be used to enhance turn on time is to modify the transistor structure in order to make it faster. FIG. 8 substantially reproduces the transistor structure shown in FIG. 2, but also shows the bipolar current path 910 that the carriers take between the collector and the emitter of the bipolar device. By way of contrast, FIG. 9 shows a similar device, but where the base has now been modified such that it can now be regarded as being formed of first and second base regions 920 and 922. The first base region 920 is disposed adjacent the collector (or at least adjacent part of the collector or a collector-like implant that is electrically connected to the collector) such that a separation between the first base region 920 and the collector 200 (or a collector-like region electrically or physically connected to the collector) controls the trigger voltage by way of punch through and/or impact ionization trigger mechanisms. The second base region 922 forms a very thin base region extending beneath the emitter. In the illustrated configuration, the base of the bipolar device is tapered such that a thickness of the first base region 920 is greater than a thickness of the second base region 922. In one embodiment, the base width of the second base region 922 is in the range of about 80 nm to 100 nm. For example, the second base region 922 (disposed as a layer beneath the emitter region) can have a nominal width of substantially 80 nm to 100 nm for a 40 volt device.

The provision of the thin second base region 922 allows the unity gain frequency IT to be increased from, for example, 22 MHz in the device of FIG. 8 to 1.7 GHz in the device of FIG. 9 where both transistors are fabricated using the same fabrication "process". Furthermore in each case the trigger voltage is layout adjustable by the distance between the edge of the base and the collector. This faster device can be achieved by doping the collector region such that it is spatially more extensive such that it underlies the base and emitter regions so as to promote a vertical current path 910. This may be achieved by varying (increasing) the doping in the epitaxial layer towards the surface of the transistor to make it more like the collector.

As persons of ordinary skill in the art will appreciate, there is an optimum speed for a fast bipolar transistor which is a function of current, as initially increasing the device current causes the peak speed to be increased, but as the current rises further the Kirk effect takes over and starts to reduce the device speed. As persons of ordinary skill in the art will appreciate, the Kirk effect causes the base width to increase at higher current densities.

Figure 10:
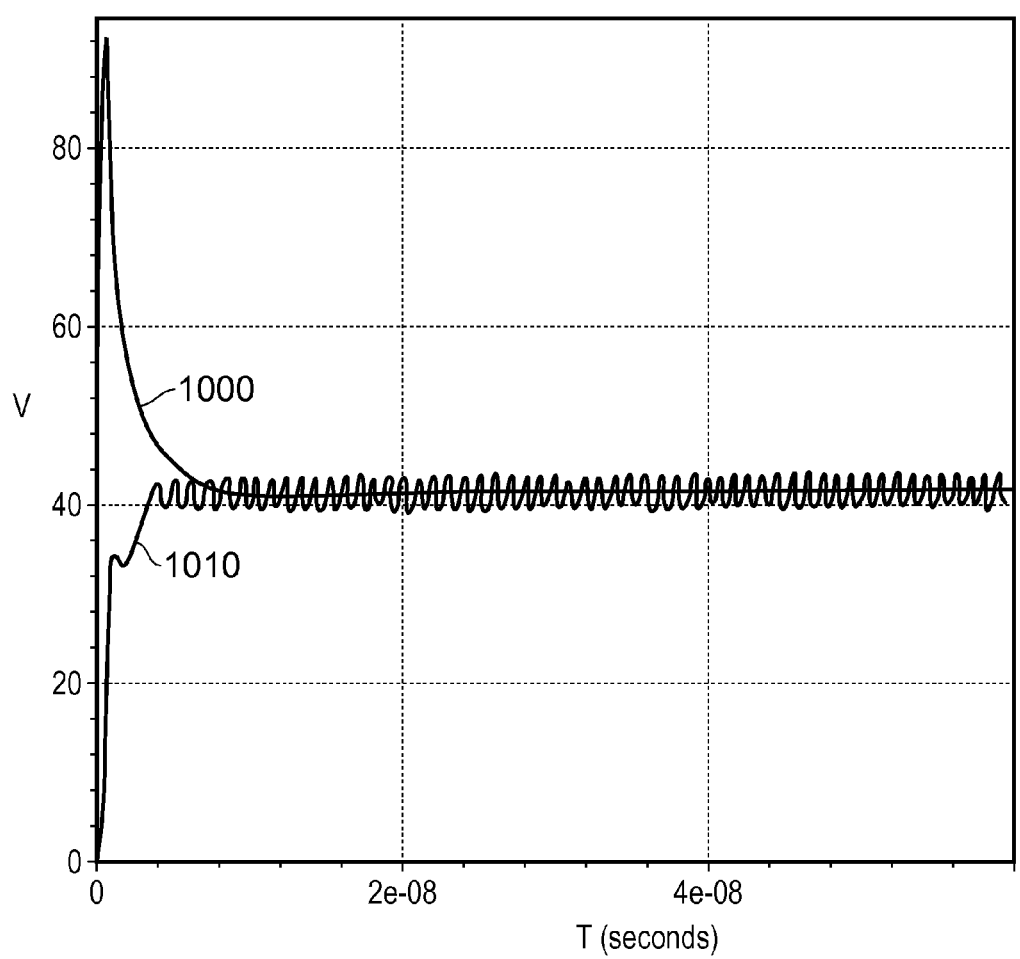
FIG. 10 compares the response of the collector voltage as a function of time for the transistor of FIG. 9 compared to that of FIG. 2.

FIG. 10 compares the transient response of the transistor of FIG. 8 with a transient response of the transistor of FIG. 9, designated 1000 and 1010, respectively. It can be seen that with the fast bipolar transistor there is effectively no overshoot whatsoever as the device is able to respond almost immediately.

For the fast bipolar transistor the current density $$Jc \leq qv_s N_c$$

where
Jc is the current density,
q is the charge on the electron,
$v_s$ is the electron thermal velocity,
$N_c$ is the number of carriers.

For a device $N_c$ may be around $3\times10^{15}$ carriers per cubic cm. Jc may have a target value of no more than 50 μA per $\mu m^{-2}$. The target current may be around 60 amps, giving a device area of 320000 $\mu m^2$.

It is possible to trade off device size by making the transistor less fast, having a slightly wider base or design that is nearer to that of FIG. 8, and introducing a capacitance between the base and collector in order to enhance turn on time.

Figure 11:
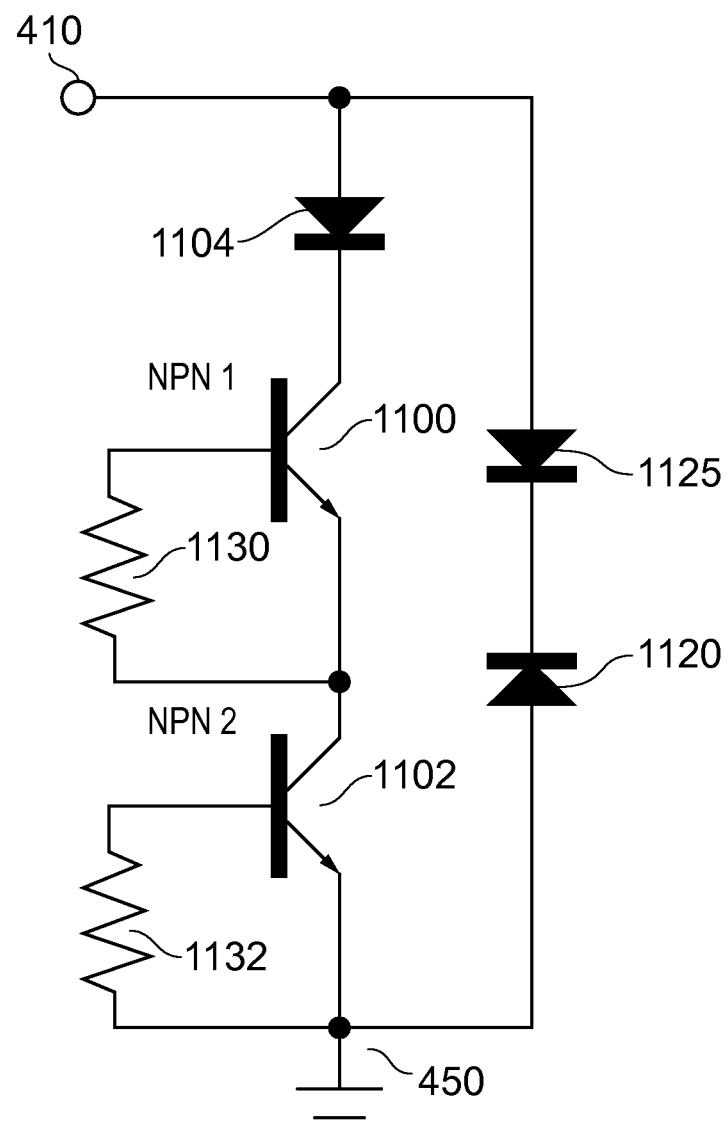
FIG. 11 shows a modified protection device with parallel protection diodes.

FIG. 11 shows a further variation in which a protection transistor, for example of the type shown in FIG. 1, FIG. 2 or FIG. 9, and designated 1100, is provided in a current flow path between a node to be protected 410 and a discharge path 450. The transistor 1100 may be provided in series with a second transistor 1102 similarly configured and a protection diode 1104 which serves to prevent reverse current flow. For example, the protection diode 1104 can prevent a flow of current from the discharge path 450 to the node to be protected 410 when the voltage of the node to be protected 410 is less than that of the power low or ground supply associated with the discharge path 450. If the transistors 1100 and 1102 exhibit slight leakage currents, then they will also share the voltage across them in a more or less equal manner. Thus, when a single transistor can protect to a magnitude of 40 volts, the 2 transistors can protect to 80 volts. This may be further extensible to higher voltages. Additionally a clamping diode or diodes 1120 are provided between the node to be protected 410 and the discharge path 450, together with a further protection diode 1125 which serves to prevent reverse current flow. The transistor 1100 and, where it is provided transistor 1102 may be provided with respective resistors 1130 and 1132 between their base and emitters in order to control the holding voltage of the device. Inductors may be used instead of or as well as resistors to control the flow of base current as this affects the holding voltage. The function of the diode 1120 is to breakdown rapidly and to clamp the voltage at the node to be protected 410 whilst the transistors 1100 and 1102 turn on. As noted before the transistors may be associated with further PNP transistors such that they form a silicon controlled rectifier arrangement. As was described earlier with respect to FIG. 4, the transistors may further be associated with capacitors between their collectors and their base or between the node 410 and their bases in order to enhance device turn on time. The breakdown voltage for the transistor 1100 if only a single transistor is provided, or for the sum of the transistors where a plurality of transistors are provided in series, is set to be less than the breakdown voltage for the clamping diode. This ensures that the transistors turn on. A similar circuit can be built around PNP lateral transistors to provide protection against ESD events of opposite polarity.

Figure 12:
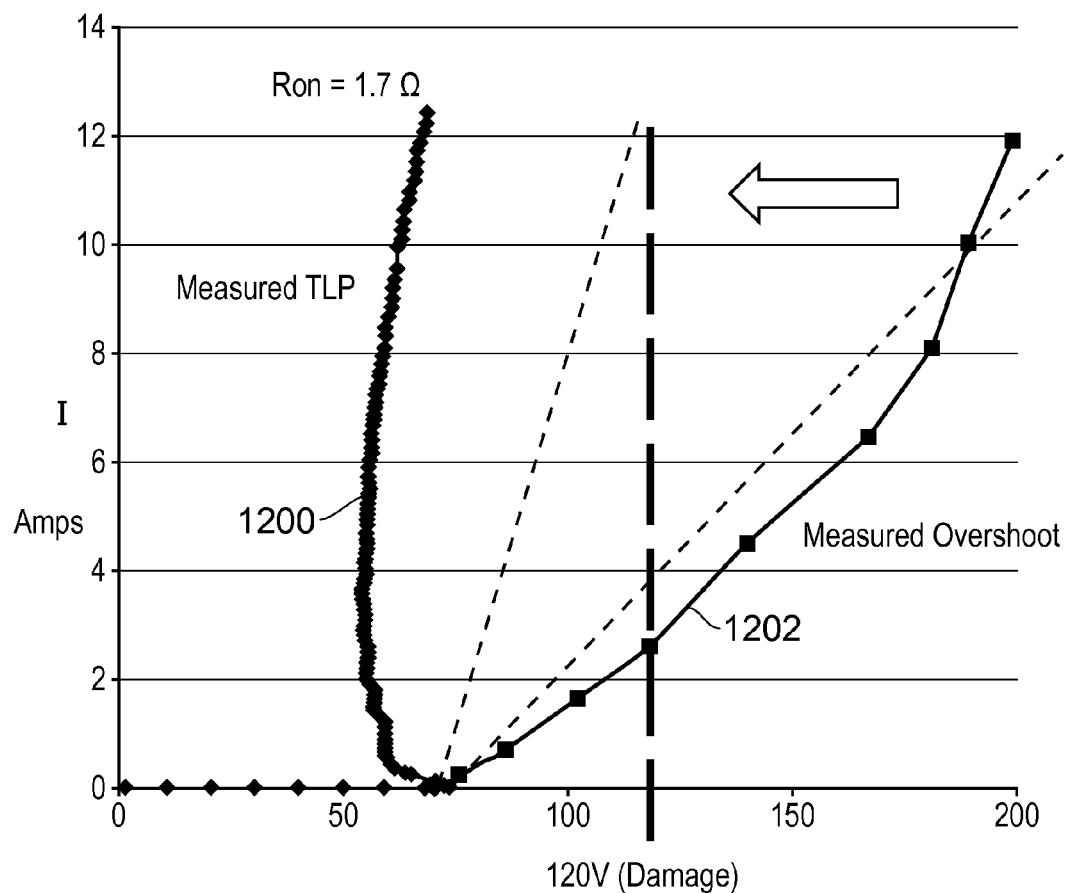
FIG. 12 is a graph showing node voltage versus current flow at a node protected by the circuit shown in FIG. 11.

FIG. 12 schematically illustrates and compares the operation of a diode clamp arranged to break down at 70 volts with that of the transistor 1100 optionally with transistor 1102 provided and operating to provide voltage clamping and fold-back. For the bipolar transistor based protection device, after breakdown or a trigger occurs, the voltage folds back to a holding voltage of around 50 to 55 volts, and then slowly increases as the ESD current increases giving an effective on resistance of about 1.7 ohms, as shown by line 1200. By comparison the diode exhibits a resistive characteristic once it starts to conduct, and therefore the voltage continues to rise with increasing ESD current as represented by line 1202. This means that the voltage across the devices connected to the node 410, which is supposed to be protected, may exceed a limit voltage, for example 120 volts where damage occurs. It is therefore desirable to reduce the apparent resistance of the diode 1120, which in this example is around 12 Ohms.

Figure 13:
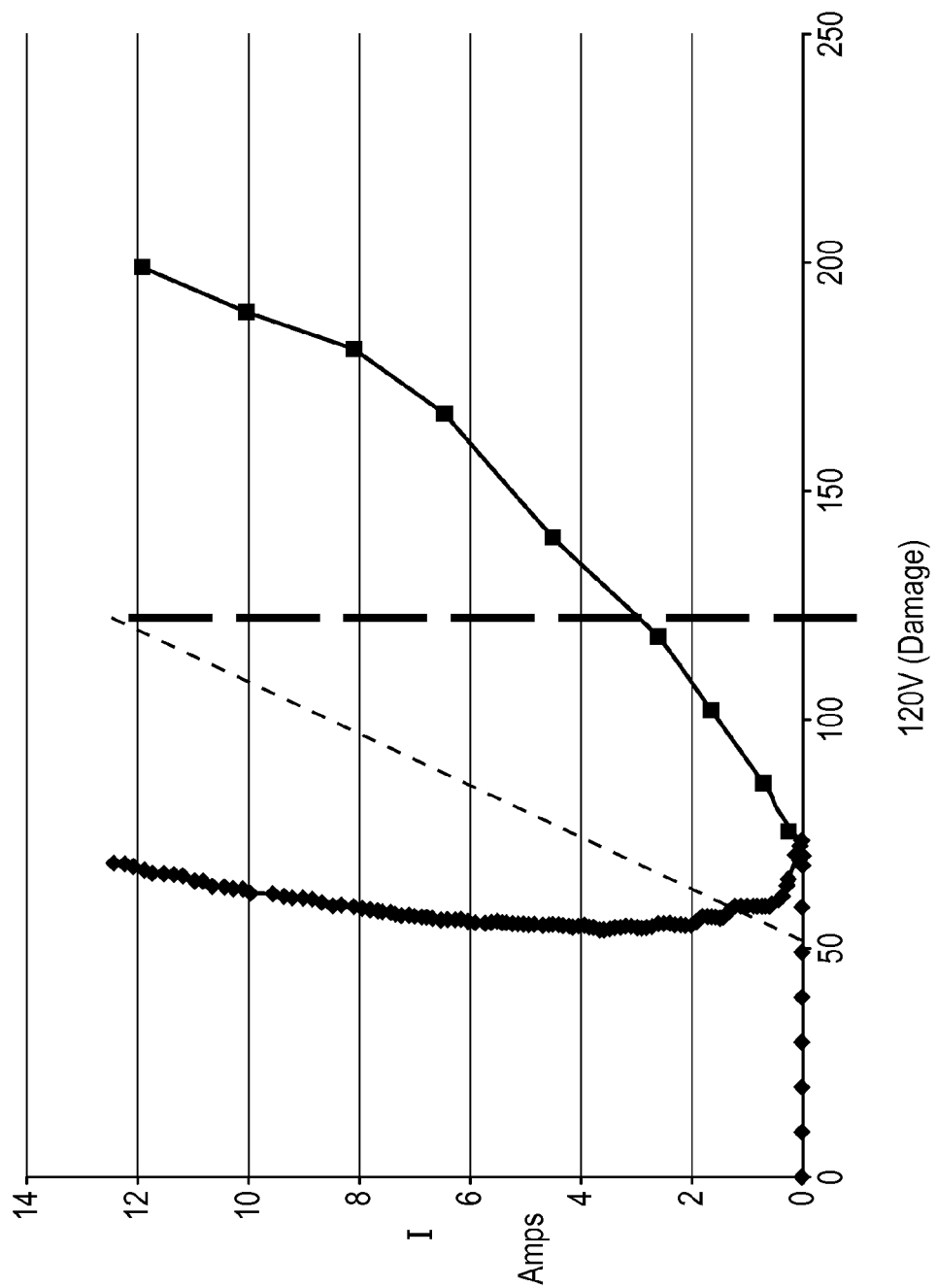
FIG. 13 is a graph illustrating how choosing a reduced clamping voltage for the clamping diode facilitates limiting the peak voltage for a maximum node current.

As known to the person skilled in the art, reducing the diode resistance can be achieved by placing a plurality of diodes in parallel, which is equivalent to making one larger (wider) diode. This can however be expensive in terms of die space or area. One approach to reducing the area overhead is to change the diode breakdown voltage such that is comes on (breaks down) at a lower voltage closer to the nominal holding voltage of the transistor. Thus, as shown in FIG. 13, if the diode is arranged to turn on at about 50 volts, then in order to conduct a required maximum current of 12 amps without exceeding the 120 volt damage threshold, the effective on resistance of the diode can be calculated at 5.8 ohms. Hence the diode area can be significantly smaller. Furthermore, having a lower breakdown voltage generally requires fewer series connected diodes in order to achieve that breakdown voltage giving a further reduction in die area. Thus reducing the break-down voltage reduces the die area required.

Figure 14:
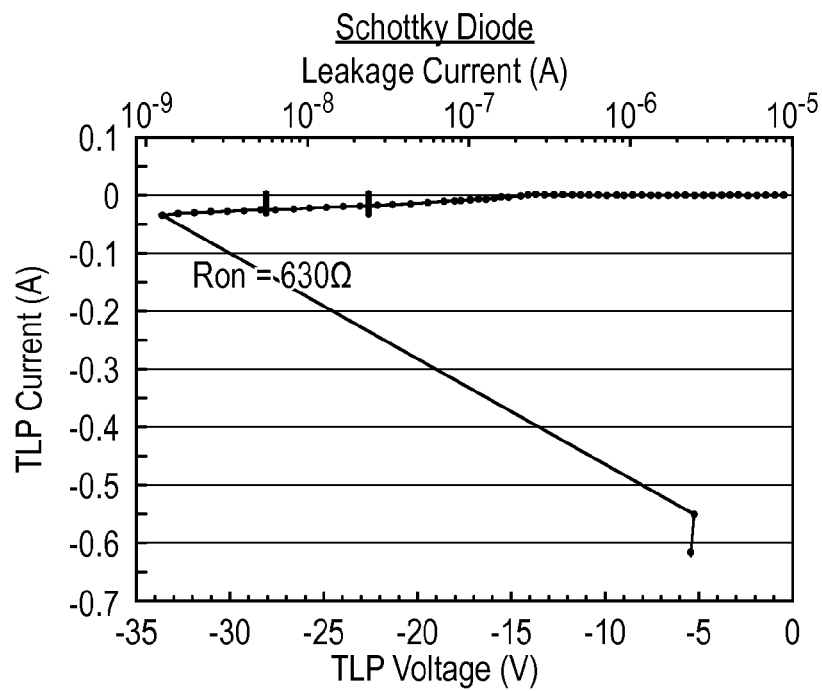
FIG. 14 is a graph illustrating Schottky diode performance for the purpose of calculating die area required for the clamping diode of FIG. 11.
Figure 15:
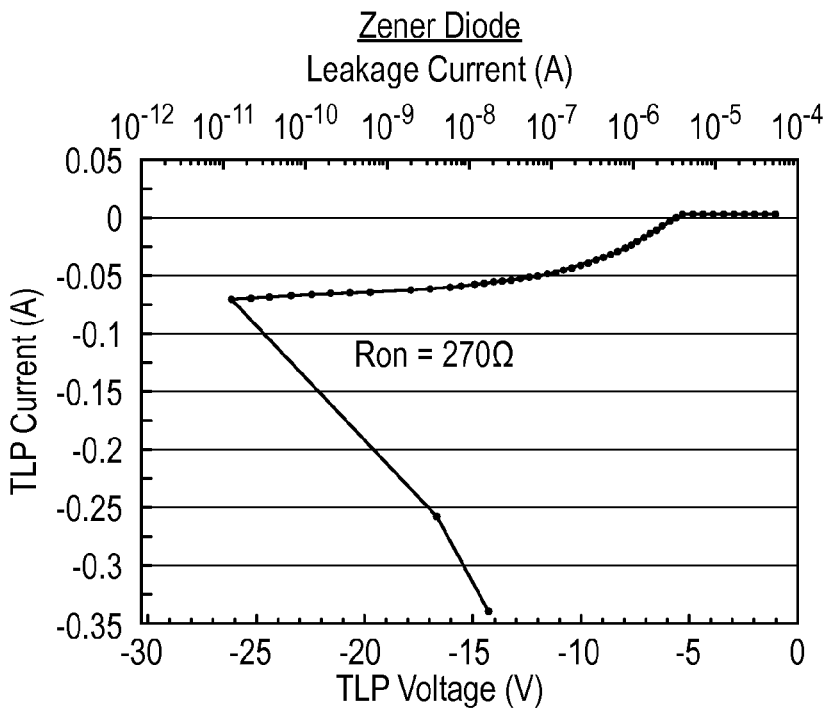
FIG. 15 is a graph illustrating Zener diode performance for the purpose of calculating the die area required.

FIGS. 14 and 15 compare die area as a function of diode type in order to illustrate how choice of diode technology can also be significant. In each case, a breakdown voltage of around 40 volts is desired. For FIG. 14, Schottky diodes were used each having a breakdown voltage at 13.61 volts when reversed biased, and as such three series connected diodes are used in order to give the desired breakdown voltage.

When the diodes turn on they have an effective resistance of 630 ohms. Placing banks of diodes in parallel allows the effective diode resistance to be reduced to a 2.6 ohm or 2.5 ohm target (use of the lower resistance allows the breakdown voltage to be increased again), and taking this into consideration, we have an effective area multiplication of 969 times the unit diode size, giving a total die area of approximately 48,450 $\mu m^2$.

If the same performance is desired using Zener diode technology, then the Zener diodes breakdown at approximately 5.15 volts when reversed biased and consequently eight are used in series. However, when the diodes become conducting they give an effective on resistance of 270 ohms. Thus, taking the number of series diodes that are used to achieve the breakdown voltage, and the number of parallel paths that are required to achieve the desired on resistance, this gives rise to an area multiplication of 1038 which, taking account of the Zener device size, gives a footprint of approximately 96,858 $\mu m^2$ on the die.

Thus, it can be seen that despite the higher on resistance of the Schottky diodes, taking their breakdown voltage into account, the "real estate" or area on the die used to achieve the desired clamping performance is reduced compared to Zener diode technology.

Diode area can be reduced by employing vertically fabricated diodes.

Figure 16:
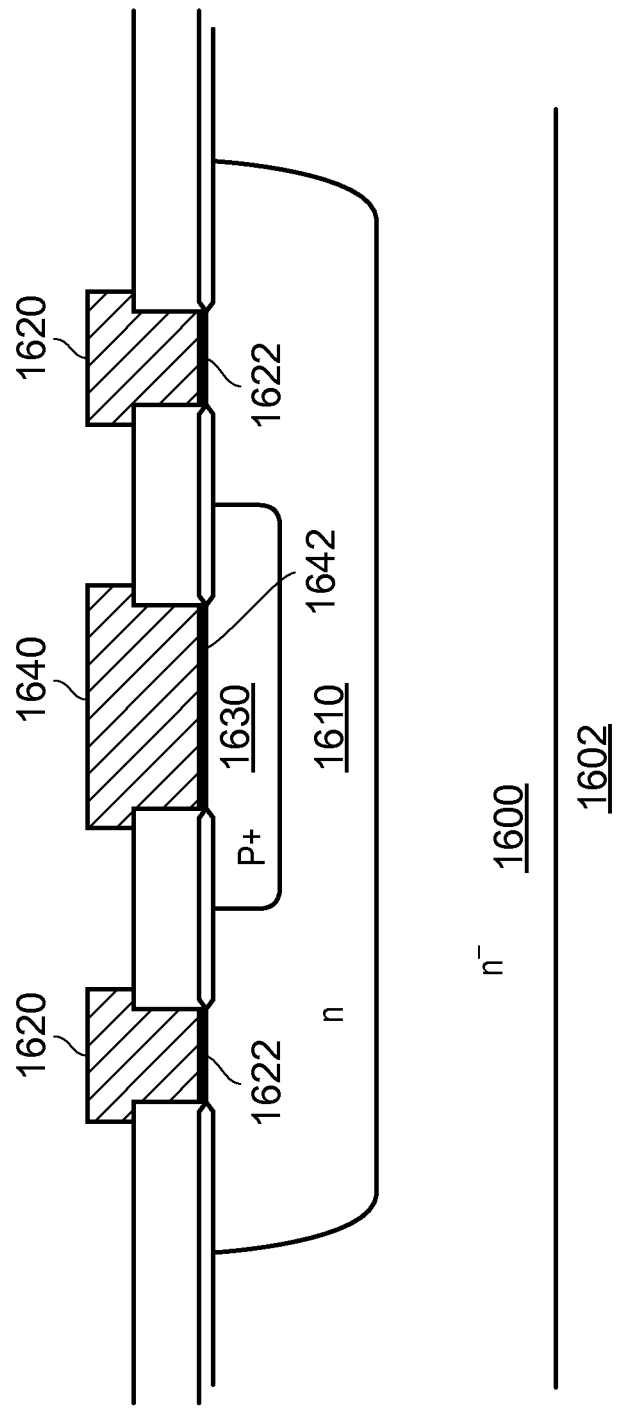
FIG. 16 is a cross-section through a modified diode structure so as to form a vertical diode.

FIG. 16 is a cross section through a vertical diode formed in accordance with an embodiment of the present invention. Thus, many steps of the fabrication process can be similar to that of the transistor shown in FIG. 2. In this example an N− type epitaxial layer 1600 is formed over a substrate 1602, and may be separated therefrom by an insulating layer associated with silicon on insulator (SOI) fabrication processes. Next an N region 1610 is formed over the N type region 1600, and brought to the surface where it makes contact with conductors 1620, operationally by way of highly doped N++ regions 1622.

A P type region 1630 is formed within the N well 1610 and makes electrical connection to a further contact 1640, optionally by way of a highly doped P++ region 1642. The highly doped regions 1622 and 1642 are included to reduce the Ohmic resistance to the contacts. When reverse biased, the P type region 1630 and N type region 1610 may undergo impact ionization driven breakdown. However, the physical structure of the diode arrangement shown in FIG. 16 tends to cause the impact ionization to be fairly uniformly distributed along the lower surface of region 1630. Thus, because a significant proportion of the diode is used to conduct electricity under breakdown conditions, it provides a relatively compact structure. Furthermore, the breakdown voltage of the diode is relatively easily controlled by manipulating the acceptor concentration of impurities in the P+ region 1630.

For example, if the region 1630 is doped at a concentration of approximately $10^{14}$ impurity atoms per cubic centimeter (which is similar to the doping of the region 1642) then the breakdown voltage is approximately 11.9 volts. If the impurity concentration is reduced to $6.4 \times 10^{12}$, then the breakdown voltage is increased to approximately 46 volts. Reducing the impurity concentration to $4.4 \times 10^{12}$ gives rise to a breakdown voltage of approximately 51.9 volts, whereas reducing the impurity concentration to $2.0 \times 10^{12}$ atoms per cubic cm gives rise to breakdown voltage of approximately 62.3 volts.

Figure 17:
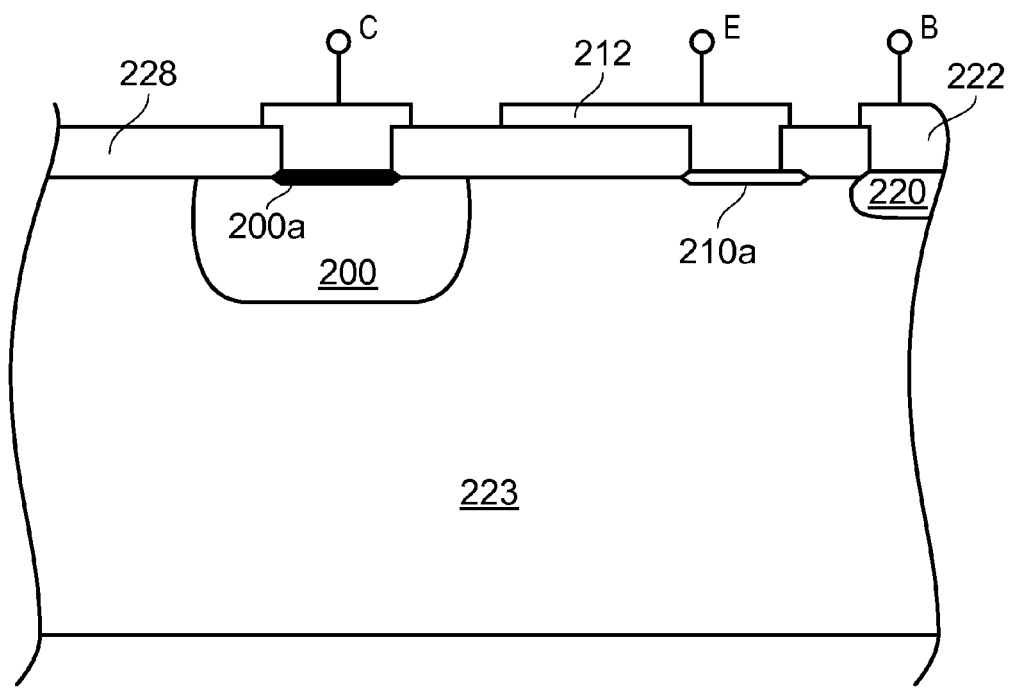
FIG. 17 is a cross-section through a modified transistor structure where the collector and emitter regions are formed adjacent each other to facilitate punch through of the transistor.

In a further variation the bipolar transistor structure can be varied in order to promote punch through between the collector and emitter. In order to achieve this, the collector and emitter regions may be formed adjacent one another as shown in FIG. 17. Here, the collector 200 and its contact region 200a are formed as was before described with respect to FIG. 2. However, the emitter is, in this example, now comprised of very highly doped region 210a positioned beneath the emitter contact of electrode 212. The electrode 212 may be extended towards the collector, but does not touch it, so as to form a field plate (which may also be referred to as a resurf structure). The base can be formed of heavily doped region 220, which connects the base to the P+ material or region 223 of the body. Thus the emitter and collector contact regions are adjacent one another (in that the base contact is not between them) but are not contiguous with one another.

Figure 18:
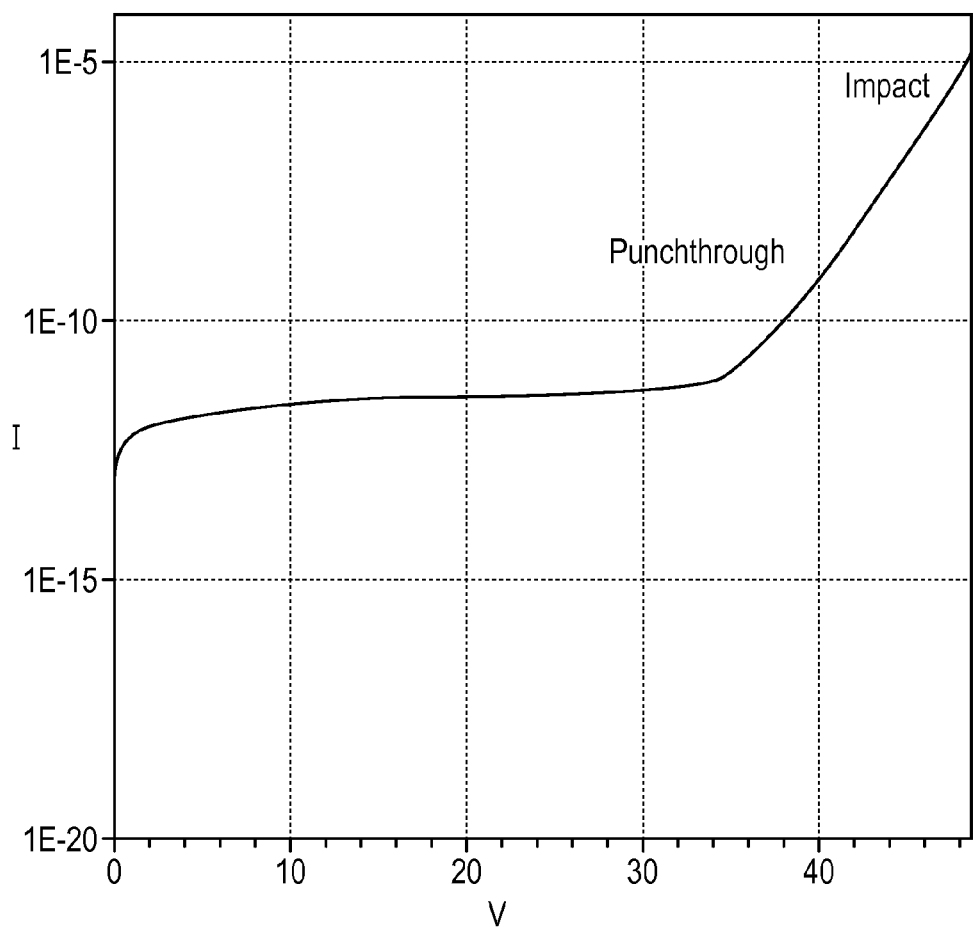

In use, current flow between the collector and emitter is generally constrained to be near the surface of the device. This can provide a fast device because the base width in the conduction path is effectively very small due to the modified geometry of the device. The spacing between the collector and emitter regions can be adjusted to adjust the amount of punch through and the device turn on voltage. In simulations, and as shown in FIG. 18, punch through can, for example, start to become significant at voltages of around 35 volts or so, where it starts to increase the device current above the device leakage current of around $10^{-12}$ amps. Punch through then remains dominant from about 35 volts to about 45 volts where impact ionization takes over to provide a greater base current to the device.

Figure 19:
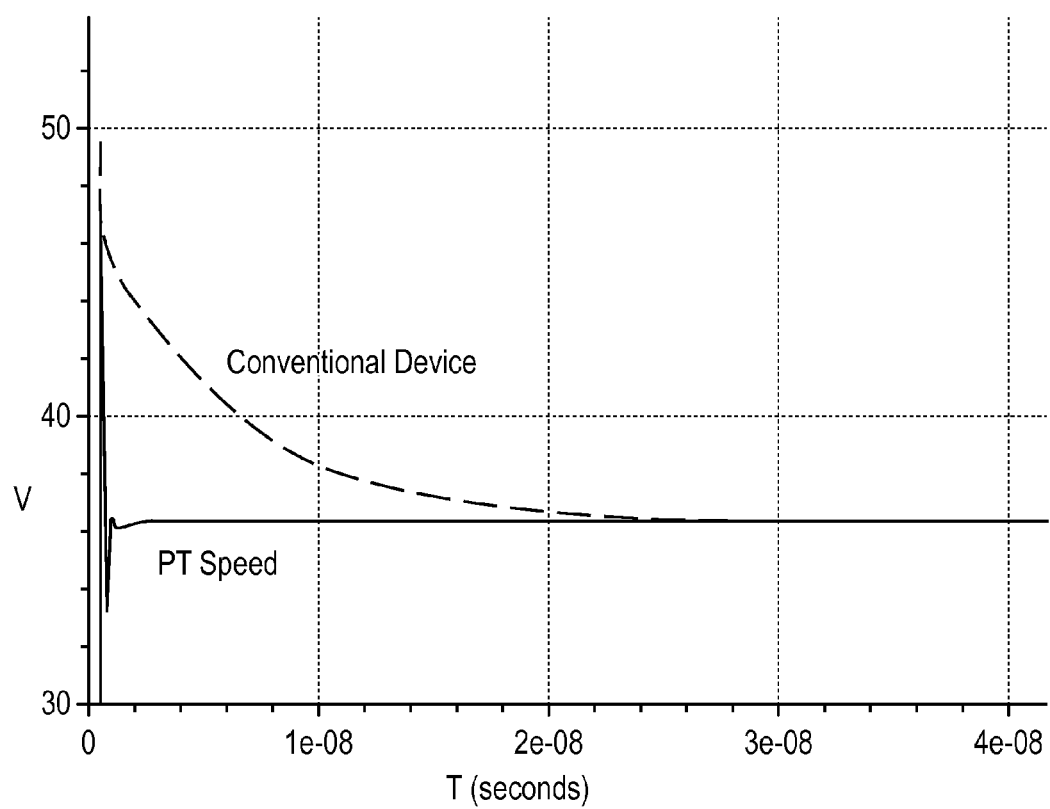
FIG. 19 compares the transient response of the punch through transistor of FIG. 17 with that of the transistor of FIG. 2 in response to an IEC CDM event.
Figure 20:
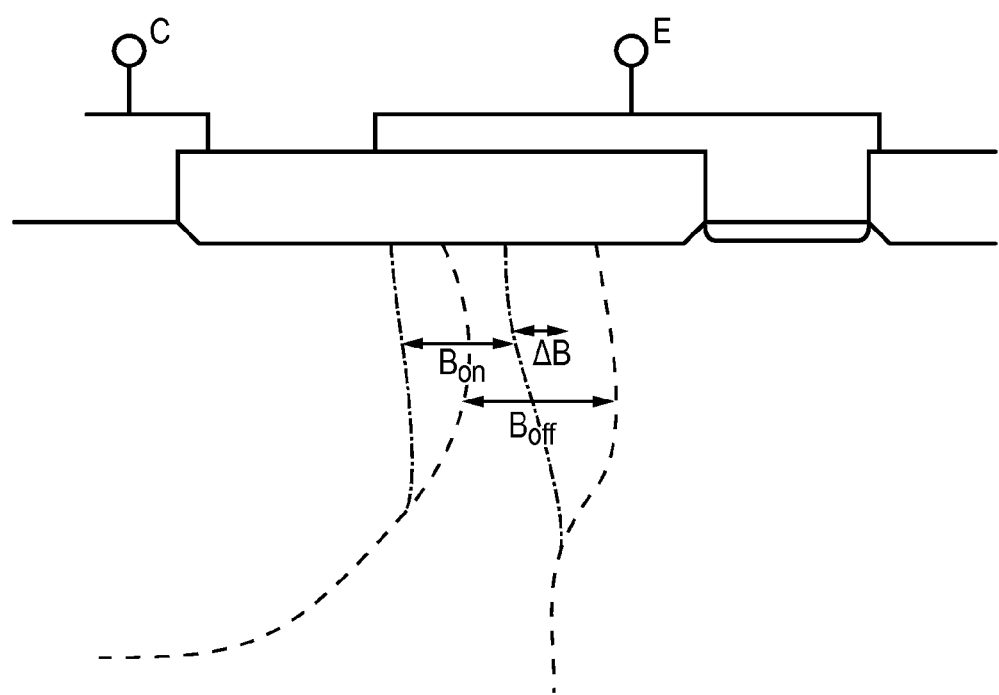
FIG. 20 schematically illustrates effective base width modulation in the punch through transistor of FIG. 17.

FIG. 19 compares the speed of the punch through device shown in FIG. 17 with that of the device shown in FIG. 2. The time taken to turn the punch through device on is significantly less compared to the device of FIG. 2, and that manifests itself in a reduced voltage spike under the IEC test conditions. However the designer should take account of the kirk effect when operating a punch through transistor because, as shown in FIG. 20, the base width changes by a value ΔB between a device operating in the on condition as represented by chain-dot lines and having an effective base width $B_{on}$, and the off condition as represented by chain lines and having an effective base width $B_{off}$, where these lines represent the effective boundary regions of the base region.

In the punch through device of FIG. 17 the holding voltage becomes related to the trigger voltage. Doping concentrations and device dimensions can determine the trigger voltage, but the emitter can generally be manipulated to change the holding voltage. For example the emitter depth can be made deeper or shallower to vary the holding voltage. Varying the emitter depth varies the base current and hence the gain of the transistor, and the holding voltage is substantially inversely proportional to the gain. Furthermore the distance between the base and the emitter can also be varied to adjust the gain of the device and hence its holding voltage.

Figure 21:
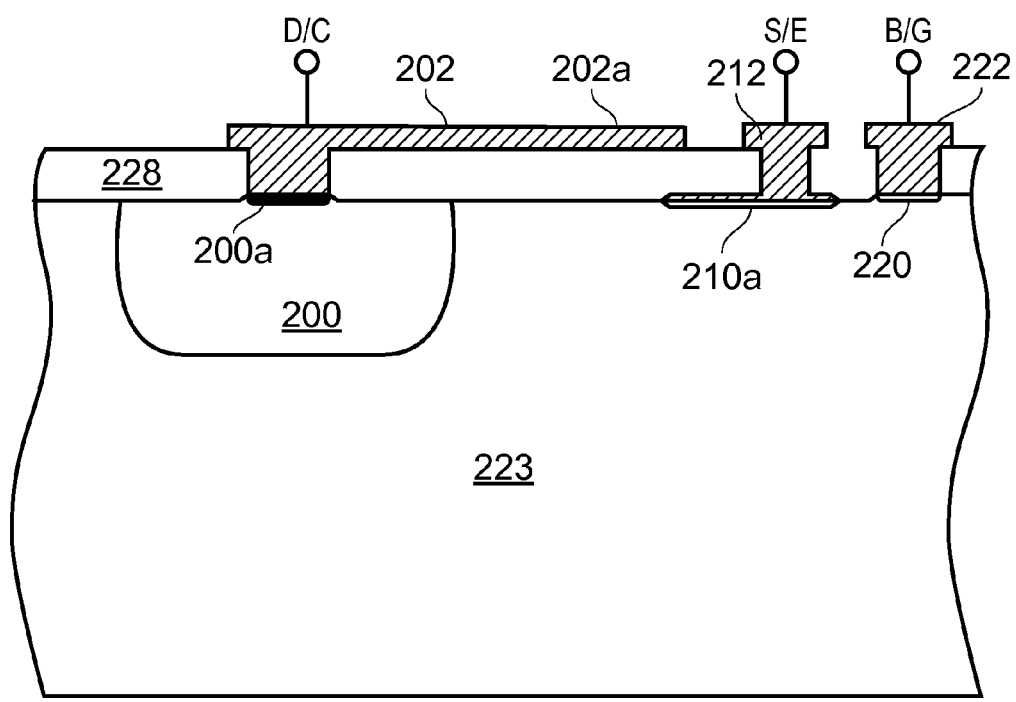
FIG. 21 is a cross section through a further embodiment of a protection device where a bipolar transistor and a field effect transistor are substantially coincident within the semiconductor material.

FIG. 21 illustrates a further modification, which in many ways is similar to that shown in FIG. 17, except that now rather than extending the emitter electrode towards the collector, the collector electrode 202 is extended towards the emitter region. Alternatively, a separate electrode could be fabricated between the collector and emitter regions and biased to an appropriate voltage. The electrode may be formed of metal or polysilicon. In the configuration illustrated in FIG. 21, an extension portion 202a of the collector electrode 202 is separated from the P type body 223 of the transistor by way of an insulating region 228. Thus, the electrode extension 202a effectively forms a gate region between the emitter region 210a and the collector region 200. Thus it is possible to fabricate a MOSFET transistor which is coincident with the NPN bipolar transistor. The MOSFET action can be quite rapid giving rise to the formation of a relatively shallow conductive channel at the surface of the device. The conductive channel connects the collector and emitter regions together, such that they function as the drain and source of the MOSFET. Meanwhile the voltage may still start to build across the bipolar transistor even as the MOSFET turns on, giving rise to punch through and/or impact ionization driven breakdown mechanisms. Thus the punch through transistor structure of FIG. 17 can be formed in association with the high voltage MOS of FIG. 21 in the same device due to the fact that the collector and emitter regions are formed adjacent one another, and that the base contact region is formed to one side of the device so as not to be between the collector and emitter.

It is believed that formation of the field effect transistor may, in fact, enhance operation of the bipolar transistor since formation of the relatively thin channel gives rise to impact ionization within the channel which in turn drives the base current of the bipolar transistor. Thus, the field effect transistor can to some extent be regarded as turning the bipolar transistor on.

In some embodiments, the profile of the collector electrode may, when viewed from above, have an irregular shape, thus the extension 202a may be formed in some areas of the collector electrode 202 but not in others such that some parts of the device are definitely more bipolar-like and some parts of the device are more field effect transistor-like. It is also possible to vary the doping concentration at the surface of the device, in those regions where it will cooperate with the collector extension 202a (or with a separately formed electrode) to modify the electrical properties of the field effect transistor. The device shown in FIG. 21 may be substantially linear, or may exhibit reflection or rotational symmetry. Thus, for example, the device could exhibit reflection or rotational symmetry around the base/gate electrode 222, or indeed around the drain/collector electrode if this was desired. Under such circumstances the extension 202a would extend from either side of the region 200a.

Figure 22:
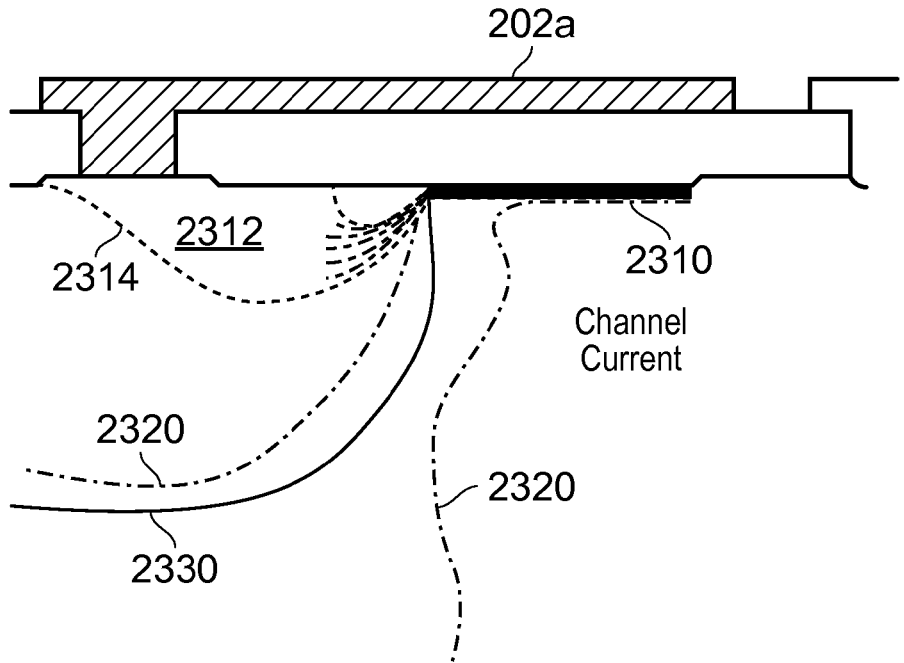
FIG. 22 shows regions of channel current within the transistor shown in FIG. 21.

FIG. 22 is a simulation showing where the channel current predominantly flows during the conduction phase of the field effect transistor. As shown in FIG. 22, the channel current is constrained to a relatively thin region 2310 as it passes between the emitter and collector regions before fanning out into a broader region 2312. In FIG. 22 the chain line 2314 represents in broad terms the spatial extent of the channel, the chain-dot lines 2320 represent the edges of the depletion region and the solid line 2330 represents the nominal spatial extent of the drain doping.

Figure 23:
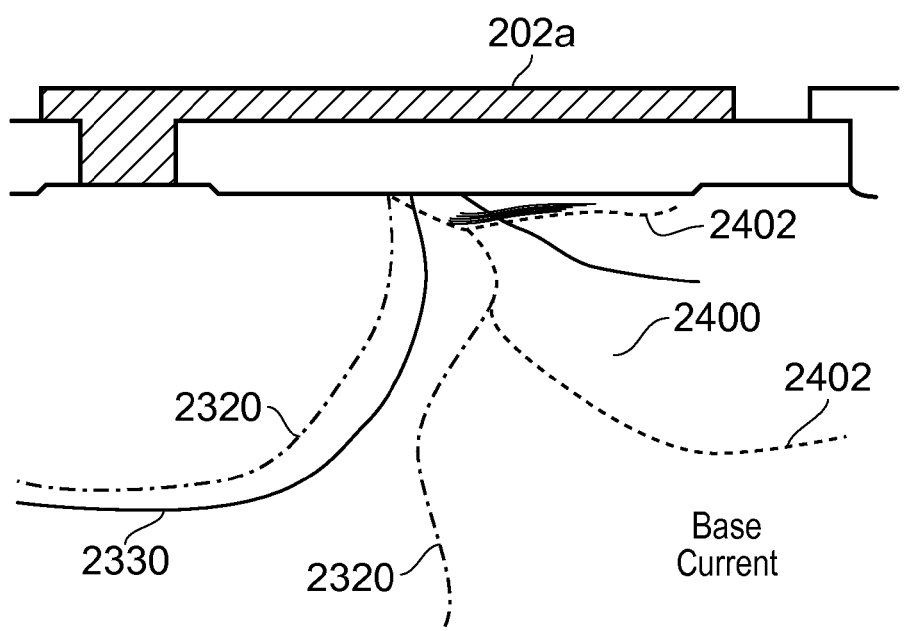
FIG. 23 shows regions of base current within the transistor shown in FIG. 21.

FIG. 23 is similar to FIG. 22, but shows the regions of current flow of the base current once the bipolar action has become established. The base current occurs in region 2400 whose boundaries are delimited by the chain lines 2402.

The punch-through transistor or punch-through plus FET transistor structures described here can be used in the circuits described with respect to FIGS. 4 and 11, and also with the vertical diode structures.

Figure 24:
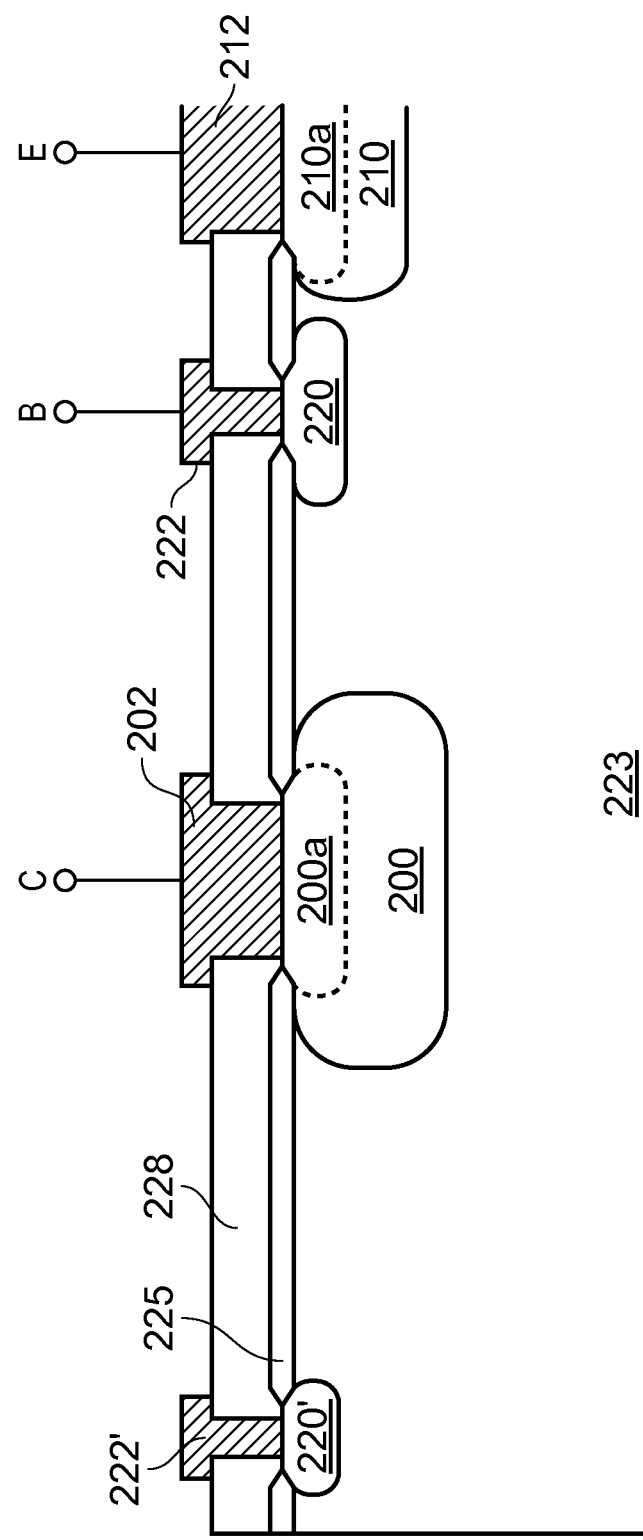
FIG. 24 shows a further modification to the arrangement shown in FIG. 2.

In a further variation briefly mentioned hereinbefore, the transistor of FIG. 2 can be modified to increase the relative interface area between the base and collector regions thereof. An example of such a device is shown in FIG. 24 where a further base contact 222' and a further base region 220' are formed towards the left hand side of the Figure complimenting the base regions 200 and 222 formed towards the right hand side of the Figure. Including the further base contact 222' and further base region 220' provides an increased reversed biased diode area between the collector and base regions such that once the diode starts to break down there is more volume of semiconductor involved in the conduction, and hence the on resistance of the diode is less. The breakdown of the intrinsic diode limits voltage drives across the device during the time period taken for the bipolar transistor to become conductive.

Figure 25:
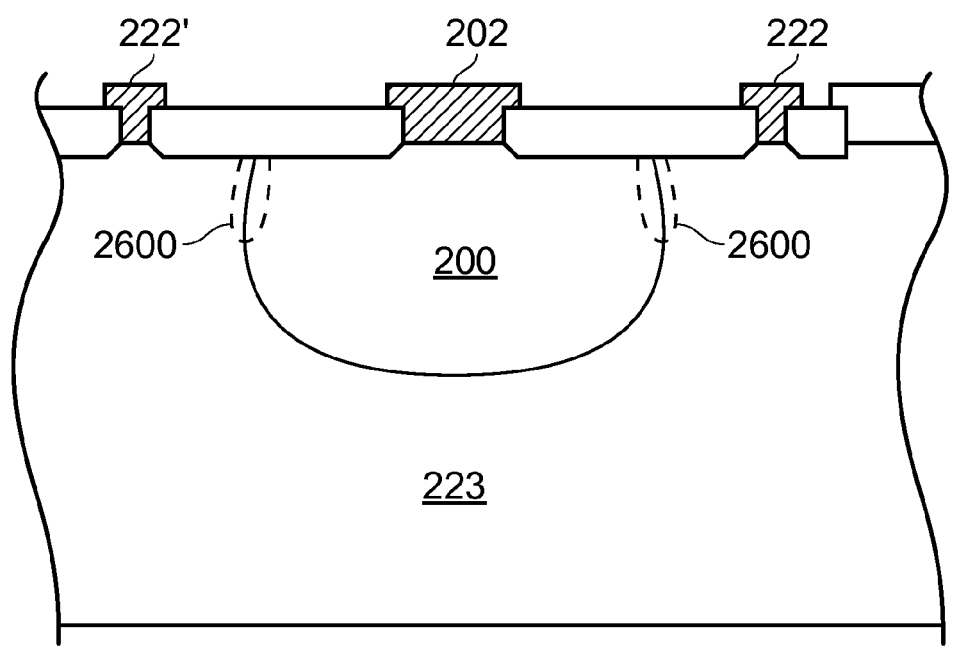
FIG. 25 shows regions of impact ionization in the device of FIG. 24.

FIG. 25 schematically illustrates areas 2600 where impact ionization triggers the formation of a base current. The impact ionization area is roughly doubled, giving rise to more base current to turn the transistor on and reduced resistance while the collector base junction acts as a clamping diode while the transistor or silicon controlled rectifier is in the process of turning on.

Figure 26:
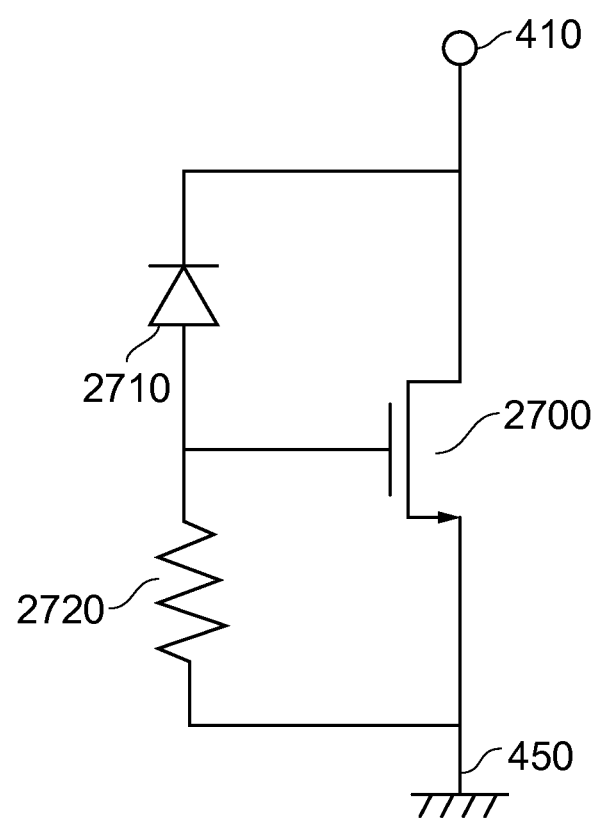
FIG. 26 shows a further embodiment of a protection device.

In a further modification the arrangement shown in FIG. 11 may be modified such that a reversed biased diode is arranged to breakdown at a trigger voltage, and to turn a fast field effect transistor on. Such an arrangement is shown in FIG. 26 where a FET 2700 is connected between the node to be protected 410 and the discharge path 450. The gate of the transistor could be directly connected to the source of the transistor if the threshold voltage $V_{TH}$ of the device is set to a suitable value to act as a trigger voltage, either by doping or by spacing of the gate above the semiconductor forming the FET. Alternatively, a reverse biased diode 2710 having a suitable trigger voltage can be connected between the node to be protected 410 and a gate of the FET 2700. A resistor 2720 can be provided to hold to gate voltage at the voltage of the discharge path, thereby presenting leakage currents in the diode 2710 turning the transistor on.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments of the have been described, these embodiments have been presented by way of example only, and are not intended to limit the scope of the disclosure. Indeed, the novel transistors, devices, apparatus, systems, and methods described herein may be embodied in a variety of other forms. Furthermore, various omissions, substitutions and changes in the form of the transistors, devices, apparatus, systems, and methods described herein may be made without departing from the spirit of the disclosure. The accompanying claims are intended to cover such forms or modifications as would fall within the scope and spirit of the disclosure. Accordingly, the scope of the present inventions is defined by reference to the claims. Although the claims have been presented in single dependency format suitable for filing at the USPTO, it is to be understood that any claim can depend on any preceding claim of the same type, except where that is clearly not technically feasible.

What is claimed is:

1. An overvoltage protection device comprising:
a bipolar transistor structure connected between a node to be protected and a discharge path, wherein the bipolar transistor structure comprises:
a semiconductor layer;
a base region in the semiconductor layer;
a collector region in the semiconductor layer;
an emitter region in the semiconductor layer, wherein the collector region and the emitter region are adjacent to one another, wherein the collector region, the base region, and the emitter region are configured to operate as a lateral bipolar transistor; and
a field plate above a portion of the semiconductor layer between the collector region and the emitter region, wherein the field plate is electrically connected to the collector region, the emitter region, or the node to be protected.

2. The overvoltage protection device of claim 1, further comprising a substrate or a well doped with impurities to form a first region of semiconductor and a second region of semiconductor, wherein the substrate or the well comprises the semiconductor layer, wherein the first region includes the collector region and the second region includes the emitter region, wherein the field plate is insulated from the substrate or the well and extends substantially between the first and second regions.

3. The overvoltage protection device of claim 2, wherein the field plate is connected to the emitter region of the bipolar transistor structure, and a distance between the collector region and the emitter region is selectable to set a trigger voltage of the overvoltage protection device.

4. The overvoltage protection device of claim 2, wherein the field plate is connected to the collector region of the bipolar transistor structure or to the node to be protected, wherein a voltage applied to the field plate is operable to deplete the portion of the semiconductor layer between the collector region and the emitter region to form a channel within the bipolar transistor structure.

5. The overvoltage protection device of claim 1, further comprising a capacitor connected between the node to be protected and the base region of the bipolar transistor structure.

6. The overvoltage protection device of claim 5, where said capacitor has a value selected to initiate conduction in the bipolar transistor structure in response to an overvoltage event.

7. The overvoltage protection device of claim 5, in which the capacitor has a value greater that 40 pF.

8. The overvoltage protection device of claim 5 in which the capacitor has a value between 50 pF and 100 pF.

9. The overvoltage protection device of claim 1 further comprising at least one voltage clamping diode between the node to be protected and the discharge path.

10. The overvoltage protection device of claim 1, wherein a portion of the base region is disposed as a layer beneath the emitter region such that the base region has a nominal width of substantially 80 nm to 100 nm for a 40 Volt device.

11. The overvoltage protection device of claim 1, further comprising a resistor between the base region and the discharge path.

12. The overvoltage protection device of claim 1, further comprising a resistive and/or inductive path between the base region and the emitter region.

13. An overvoltage protection device comprising:
a bipolar transistor structure comprising:
a semiconductor layer;
a collector region in the semiconductor layer;
an emitter region in the semiconductor layer; and
a base region in the semiconductor layer, the collector region being in a current flow path with a node to be protected from overvoltage events and with a discharge path, wherein the collector region, the base region, and the emitter region are configured to operate as a lateral bipolar transistor; and
a capacitor connected between the base region and the node to be protected, wherein the capacitor injects charge into the base region in response to an overvoltage event so as to limit voltage overshoot.

14. The overvoltage protection device of claim 13, where said capacitor has a value selected to initiate conduction in the bipolar transistor structure in response to the overvoltage event.

15. The overvoltage protection device of claim 13, wherein the capacitor has a value greater that 40 pF.

16. The overvoltage protection device of claim 13, wherein the capacitor has a value between 50 pF and 100 pF.

17. The overvoltage protection device of claim 13 further comprising at least one voltage clamping diode between the node to be protected and the discharge path.

18. An overvoltage protection device comprising a transistor or silicon controlled rectifier in combination with at least one clamping diode, wherein the at least one clamping diode comprises:
an N− epitaxial layer;
an N region in the N− epitaxial layer; and
a P+ region in the N region, wherein the P+ region and the N region operate as a vertical diode that undergoes impact ionization breakdown along a bottom of the P+ region.

19. The overvoltage protection device of claim 18, wherein a plurality of reverse based diodes are provided in parallel connected strings of series connected diodes to achieve a desired trigger voltage or a desired holding voltage and a desired resistance when conducting.

20. The overvoltage protection device of claim 18, wherein the at least one clamping diode further comprises a first conductor electrically connected to the N region and a second conductor electrically connected to the P+ region.

21. The overvoltage protection device of claim 18 wherein the transistor is a bipolar transistor structure connected between a node to be protected and a discharge path, wherein the bipolar transistor structure comprises a base region, a collector region, and an emitter region, wherein the collector region and the emitter region are adjacent to one another, wherein the collector region, the base region, and the emitter region are configured to operate as a lateral bipolar transistor.

22. The overvoltage protection device of claim 18 wherein the transistor is a field effect transistor (FET).

23. An overvoltage protection device, comprising a bipolar transistor structure connected between a node to be protected and a discharge path, wherein the bipolar transistor structure has a base region, a collector region, and an emitter region, wherein the base region comprises a first base region adjacent the collector region, but separated therefrom by an intermediate region of reduced doping concentration, such that a trigger voltage is set by the separation between the collector region and the first base region, wherein the base region further comprises a second base region vertically disposed with respect to the emitter region.

24. An overvoltage protection device as claimed in claim 23, wherein the base region is further connected to one or more of:

a capacitor connected to the node to be protected;

a capacitor connected to the collector;

a resistor connected to the discharge path;

an inductor connected to the discharge path;

at least one diode arranged to conduct at a trigger voltage.

25. An overvoltage protection device as claimed in claim 24, wherein the base region is further connected to the at least one diode, wherein one or more of the at least one diode is a vertical diode.

26. An overvoltage protection device comprising a bipolar transistor connected between a node to be protected and a discharge path, wherein a base width of the bipolar transistor is selected such that a carrier transit time across a base of the bipolar transistor gives rise to a unity gain frequency ($F_T$) value of the bipolar transistor where the inverse of the frequency is substantially equal to a predetermined rise time of an ESD event, and wherein the rise time is less than one nanosecond.

27. An overvoltage protection device comprising:

a bipolar transistor connected between a node to be protected and a discharge path; and a clamping diode assembly in parallel with the bipolar transistor, wherein a diode on resistance and breakdown voltage are selected to reduce the clamping diode assembly size, wherein the clamping diode assembly comprises:

an N− epitaxial layer;

an N region in the N− epitaxial layer; and a P+ region in the N region, wherein the P+ region and the N region operate as a vertical diode that undergoes impact ionization breakdown along a bottom of the P+ region.

* * * * *